(12) United States Patent
Sato

(10) Patent No.: US 7,704,859 B2
(45) Date of Patent: Apr. 27, 2010

(54) ELECTRO-OPTICAL APPARATUS, ELECTRONIC APPARATUS, AND METHOD OF MANUFACTURING ELECTRO-OPTICAL APPARATUS

(75) Inventor: Takashi Sato, Tottori (JP)

(73) Assignee: Epson Imaging Devices Corporation, Azumino-shi (JP)

( * ) Notice: Subject to any disclaimer, the term of this patent is extended or adjusted under 35 U.S.C. 154(b) by 432 days.

(21) Appl. No.: 11/785,217

(22) Filed: Apr. 16, 2007

(65) Prior Publication Data

US 2007/0272982 A1 Nov. 29, 2007

(30) Foreign Application Priority Data

May 23, 2006 (JP) .............................. 2006-142420

(51) Int. Cl.
H01L 21/20 (2006.01)
H01L 29/00 (2006.01)

(52) U.S. Cl. ............... 438/479; 257/347; 257/E29.001; 257/E21.09

(58) Field of Classification Search ................. 257/347; 438/479
See application file for complete search history.

(56) References Cited

U.S. PATENT DOCUMENTS

| 6,506,669 | B1 | 1/2003 | Kuramasu et al. |
| 6,534,353 | B1 | 3/2003 | Kuramasu et al. |
| 7,038,283 | B2 | 5/2006 | Yanai et al. |
| 2004/0075092 | A1* | 4/2004 | Arao ........................... 257/66 |
| 2004/0140470 | A1* | 7/2004 | Kawasaki et al. ............. 257/72 |
| 2004/0206956 | A1 | 10/2004 | Yanai et al. |
| 2005/0253148 | A1* | 11/2005 | Yamazaki et al. ............. 257/72 |
| 2005/0263709 | A1* | 12/2005 | Watanabe et al. ...... 250/370.11 |
| 2006/0081946 | A1 | 4/2006 | Yanai et al. |

FOREIGN PATENT DOCUMENTS

| JP | A-5-142571 | 6/1993 |
| JP | A-7-84285 | 3/1995 |
| JP | B2 2584290 | 11/1996 |
| JP | B2 3106566 | 9/2000 |
| JP | A-2000-347599 | 12/2000 |
| JP | A-2000-357798 | 12/2000 |
| JP | A-2003-45892 | 2/2003 |

\* cited by examiner

*Primary Examiner*—Zandra Smith
*Assistant Examiner*—Lawrence Tynes, Jr.
(74) *Attorney, Agent, or Firm*—Oliff & Berridge, PLC

(57) ABSTRACT

Provided is an electro-optical apparatus including a first thin-film transistor having a first gate electrode, a first gate insulating layer and a first active layer, which are respectively formed of a conductive film, an insulating film and a semiconductor film, in a pixel region of a device substrate, the apparatus including: a second thin-film transistor having a first gate electrode formed of the conductive film, a second gate insulating layer formed by removing a portion of the insulating film in a thickness direction and a second active layer formed of the semiconductor film, in a region other than the pixel region of the device substrate.

5 Claims, 19 Drawing Sheets

ELECTRO-OPTICAL APPARATUS, ELECTRONIC APPARATUS, AND METHOD OF MANUFACTURING ELECTRO-OPTICAL APPARATUS

BACKGROUND

1. Technical Field

The present invention relates to an electro-optical apparatus, an electronic apparatus including thin-film transistors on a device substrate, and a method of manufacturing the electro-optical apparatus.

2. Related Art

Among a variety of electro-optical apparatuses, in an active matrix liquid crystal apparatus, for example, liquid crystal is held between a device substrate 10 shown in FIGS. 19a and 19b and a counter substrate (not shown). In the device substrate 10, a pixel-switching thin-film transistor 1c and a pixel electrode 2a electrically connected to a drain of the thin-film transistor 1c is formed in each of a plurality of pixel regions 1e corresponding to intersections between gate lines 3a (scanning lines) and source lines 6a (data lines). The alignment of molecules of the liquid crystal is controlled by an image signal applied to the pixel electrode 2a from the source line 6a through the thin-film transistor 1c in each pixel. A storage capacitor 1h having a portion of a capacitive line 3b which serves as a lower electrode 3c and an extending portion of a drain electrode 6b which serves as an upper electrode 6c is formed in the pixel region 1e and an insulating film 4 for configuring a gate insulating layer 4e of the thin-film transistor 1c is used as a dielectric layer 4c in the storage capacitor 1h (FIG. 3 of Japanese Patent No. 2584290)

Meanwhile, even in an electro-optical apparatus using the bottom-gate thin-film transistor 1c shown in FIGS. 19a and 19b, as shown in the left side of FIG. 19b and FIG. 19c, when thin-film transistors 1g and 1g' used in a gate line driving circuit or a source line driving circuit are formed using a method of manufacturing the thin-film transistor 1c, a driving IC having the gate line driving circuit or the source line driving circuit included therein does not need to be separately used. That is, when the gate line 3a, the gate insulating layer 4e and an active layer 7a are formed and at the same time a signal line 3g for configuring a gate electrode of the thin-film transistor 1g, the gate insulating layer 4g and an active layer 7g are formed, a driving circuit may be included in the device substrate 10 with a smaller number of processes. In the driving circuit, a gate wiring 3g' and a drain wiring 6g need to be electrically connected and, in this case, a conductive pattern 2s is electrically connected to a lower conductive layer 3s extending from the gate wiring 3g' and an upper conductive layer 6s extending from the drain wiring 6g through contact holes 82 and 89 formed in the insulating film 4 or a passivation film 8.

However, when the active layer 7g of the thin-film transistor 1g used in the driving circuit is formed using an amorphous silicon film similar to the active layer 7a of the thin-film transistor 1c, ON current is too low compared with a case of using a polysilicon film and thus a high-speed operation in the gate line driving circuit or the source line driving circuit cannot be realized. In particular, in the thin-film transistor 1c for switching the pixel, when the thickness of the insulating film 4 used in the gate insulating layer 4e is increased for the purpose of reducing parasitic capacitance, the thickness of the gate insulating layer 4e of the thin-film transistor 1g is also increased. Thus, the ON current of the thin-film transistor 1g is too low to be used in the driving circuit.

SUMMARY

An advantage of the invention is that it provides an electro-optical apparatus, which can have a gate insulating layer of increased thickness in one kind of thin-film transistor and another kind of thin-film transistor with improved ON current characteristics even when methods of manufacturing the two kinds of thin-film transistors are the same, an electronic apparatus including the electro-optical apparatus, and a method of manufacturing the electro-optical apparatus.

An advantage of the invention is that it provides an electro-optical apparatus, in which a variation in electric characteristics or deterioration of reliability does not occur in a thin-film transistor even when ON current characteristics of the thin-film transistor are improved, an electronic apparatus including the electro-optical apparatus, and a method of manufacturing the electro-optical apparatus.

An advantage of the invention is that it provides an electro-optical apparatus, which is capable of simultaneously improving ON current characteristics of a thin-film transistor and a capacitance value per unit area of a storage capacitor, an electronic apparatus including the electro-optical apparatus, and a method of manufacturing the electro-optical apparatus.

An advantage of the invention is that it provides an electro-optical apparatus, which is capable of simultaneously improving ON current characteristics of a thin-film transistor and efficiency of the electric connection to a lower conductive layer below a gate insulating layer, an electronic apparatus including the electro-optical apparatus, and a method of manufacturing the electro-optical apparatus.

According to an aspect of the invention, there is provided an electro-optical apparatus including a first thin-film transistor having a first gate electrode, a first gate insulating layer and a first active layer, which are respectively formed of a conductive film, an insulating film and a semiconductor film, in a pixel region of a device substrate, the apparatus including: a second thin-film transistor having a first gate electrode formed of the conductive film, a second gate insulating layer formed by removing a portion of the insulating film in a thickness direction and a second active layer formed of the semiconductor film, in a region other than the pixel region of the device substrate.

According to another aspect of the invention, there is provided a method of manufacturing an electro-optical apparatus including a first thin-film transistor having a first gate electrode, a first gate insulating layer and a first active layer in a pixel region of a device substrate and a second thin-film transistor having a second gate electrode, a second gate insulating layer and a second active layer in a region other than the pixel region of the device substrate, the method including: simultaneously forming the first gate electrode and the second gate electrode; forming the first gate insulating layer and the second gate insulating layer; forming the first active layer and the second active layer; and thinning an insulating film which overlaps the second gate electrode at an upper layer side by etching to reduce the thickness of the second gate insulating layer to be smaller than that of the first gate insulating layer.

In the device substrate used in the electro-optical apparatus according to the invention, since the gate electrodes and the active layers are simultaneously formed and the gate insulating layers share a portion of the insulating film in the first thin-film transistor and the second thin-film transistor, the method of processing the thin-film transistors can be the same. Since the thickness of the gate insulating layer (second gate insulating layer) of the second thin-film transistor is smaller than that of the gate insulating layer (first gate insulating layer) of the first thin-film transistor, the thickness of the gate insulating layer of the first thin-film transistor can increase and ON current characteristics of the second thin-film transistor can be improved.

The semiconductor film may be formed of an amorphous silicon film and the conductive film, the insulating film and the semiconductor film may be formed in this order from a lower layer side. When the semiconductor film for configuring the active layer is formed of the amorphous silicon film, ON current is small and thus cannot be used in a driving circuit. However, in the invention, since the gate insulating layer of the second thin-film transistor is thin, large ON current can be obtained. Accordingly, it is possible to form the driving circuit on the device substrate by the thin-film transistor in which the semiconductor film is formed of the amorphous silicon film.

In the invention, a plurality of insulating films may be formed, the first gate insulating layer may be formed of the plurality of insulating films in the first thin-film transistor, and a lower insulating film of the plurality of insulating films may be removed in a region which overlaps the second gate electrode such that the second gate insulating layer is formed of an upper insulating film, in the second thin-film transistor.

In the method of manufacturing the electro-optical apparatus having the above-described configuration, in the forming of the gate insulating layer, the insulating film may be formed in plural and may be thinned while the insulating film is formed in plural, and the insulating film formed on the second gate electrode may be removed by etching in the thinning of the insulating film.

In using a thin portion of the insulating film as the second gate insulating layer, when the lower insulating film is removed from between the lower insulating film and the upper insulating film for configuring the insulating film and the upper insulating film is used as the second gate insulating layer, the upper insulating film and the semiconductor film (active layer) are continuously formed. Accordingly, an interface between the gate insulating layer and the active layer can be prevented from being contaminated with resist and thus the reliability of the thin-film transistor can be improved. When the entire lower insulating film is etched, the insulating film does not need to be etched up to a middle position of a depth direction and thus a variation in thickness of the second gate insulating layer due to a variation in etching depth can be prevented. Since the upper insulating film is not exposed to static electricity or plasma when the lower insulating film is partially dry-etched, damage or defect is not caused in the surface of the upper insulating film due to the static electricity or plasma. When the lower insulating film is wet-etched, the upper insulating film does not contact an etchant of the lower insulating film and a pinhole is not generated in the upper insulating film. Therefore, it is possible to prevent a variation in electric characteristics or the deterioration of reliability of the second thin-film transistor.

In the method of manufacturing the electro-optical apparatus having the above-described configuration, in the forming of the gate insulating layer, at least a last insulating film is formed at a vacuum atmosphere and the device substrate is continuously maintained at the vacuum atmosphere until the forming of the active layer starts, when the insulating film is formed in plural.

In the invention, the thickness of the upper insulating film may be smaller than that of the lower insulating film. By this configuration, the first gate insulating layer of the first thin-film transistor is sufficiently thick such that a high gate withstanding voltage is ensured. Even when parasitic capacitance is reduced, the second gate insulating layer is sufficiently thin such that the ON current characteristics of the second thin-film transistor can be improved.

In the invention, in the second thin-film transistor, the lower insulating film may be removed in an inner region spaced apart from an outer edge of a region, in which the second gate electrode and the second active layer overlap, by a predetermined distance. By this configuration, since the thick insulating film can be interposed in the outer edge of the region which the second gate electrode and the second active layer overlap, it is possible to ensure a sufficient gate withstanding voltage with respect to the second thin-film transistor even when the second gate insulating layer is thin.

In the invention, the first thin-film transistor may be formed in each of a plurality of pixel regions of the device substrate, and the second thin-film transistor may be configured as a portion of a circuit formed in the region other than the pixel regions of the device substrate. For example, the second thin-film transistor may be configured as a portion of at least one of a gate line driving circuit for outputting a scanning signal to the first thin-film transistor through a gate line and a data line driving circuit for outputting a data signal to the first thin-film transistor through a source line.

In the invention, each of the plurality of pixel regions has a lower electrode formed of the conductive film and a storage capacitor including a dielectric layer formed by removing a portion of the insulating film in the thickness direction. In the method of manufacturing the electro-optical apparatus having the above-described configuration, in the forming of the gate electrode, a lower electrode of a storage capacitor may be formed in the pixel region, and, in the thinning of the insulating film, the insulating film which overlaps the lower electrode at the upper layer side may be etched to reduce the thickness of the dielectric layer of the storage capacitor to be smaller than that of the first gate insulating layer.

By this configuration, it is possible to increase capacitance per unit area of the storage capacitor using the method of manufacturing of the second thin-film transistor and thus to improve charge holding characteristics. When a capacitance value per unit area of the storage capacitor is increased, the occupying area of the storage capacitor can be reduced and thus a pixel aperture ratio can be increased.

In the invention, the second gate insulating layer and the dielectric layer may have a same thickness. By this configuration, the second gate insulating layer and the dielectric layer can be collectively thinned. In using a thin portion of the insulating film as the dielectric layer, when the lower insulating film is removed and the upper insulating film is used as the dielectric layer, it is possible to prevent a variation in thickness of the dielectric layer due to a variation in etching depth. Since the upper insulating film is not exposed to static electricity, plasma or an etchant when the lower insulating film is dry-etched or wet-etched, damage, defect or a pinhole is not caused in the surface of the upper insulating film. Therefore, it is possible to obtain a high withstanding voltage in the storage capacitor.

In the invention, a lower conductive layer formed of the conductive film may be formed on the device substrate and the electrical connection to the lower conductive layer may be performed through a contact hole for connecting the lower conductive layer, which reaches the lower conductive layer, at the upper side of the lower conductive layer, and a portion of the insulating film may be removed in the thickness direction in a region in which the contact hole for connecting the lower conductive layer is formed. In the method of manufacturing the electro-optical apparatus having the above-described configuration, in the forming of the gate electrode, a lower conductive layer may be formed, in the thinning of the insulating film, the insulting film which overlaps the lower conductive layer at the upper layer side may be etched, and a contact hole for connecting the lower conductive layer which reaches the lower conductive layer may be formed after the active layer is formed. By this configuration, when the contact hole for connecting the lower conductive layer is formed, the insulating film which covers the lower conductive layer is thin and thus an etching time necessary for forming the contact hole for connecting the lower conductive layer is short.

The electro-optical apparatus according to the invention is applicable to an electronic apparatus such as a mobile telephone or a mobile computer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 19A:
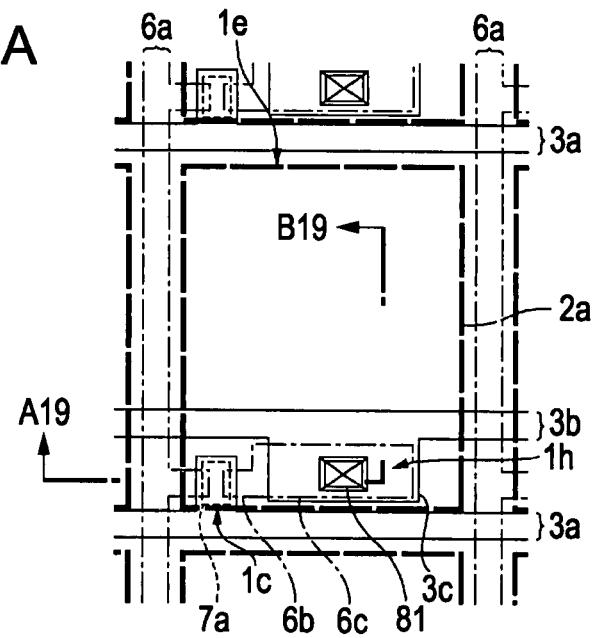
FIGS. 19a, 19b and 19c are respectively a plan view showing one pixel of a conventional liquid crystal apparatus, a cross-sectional view taken along line A19-B19, and a plan view showing a thin-film transistor used in a driving circuit.
Figure 19B:
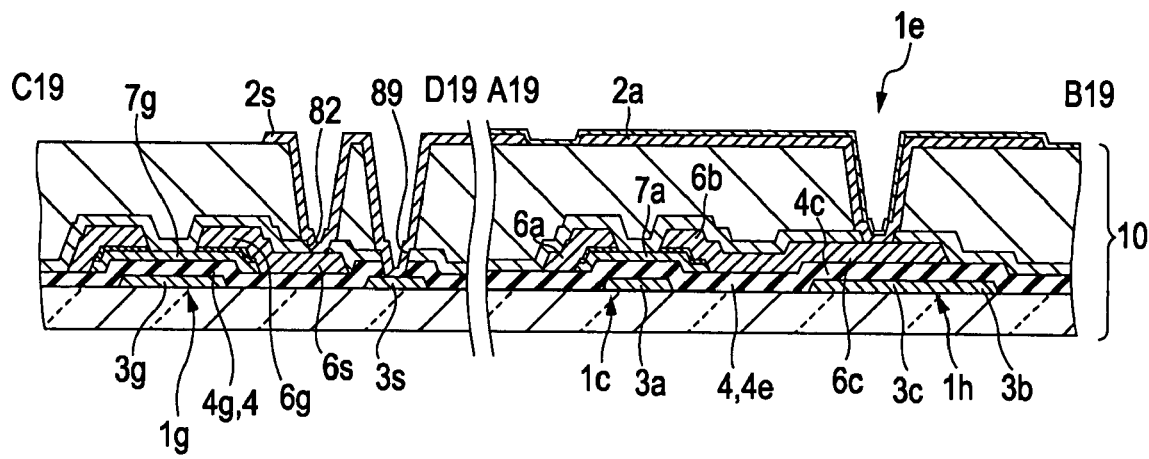
Figure 19C:
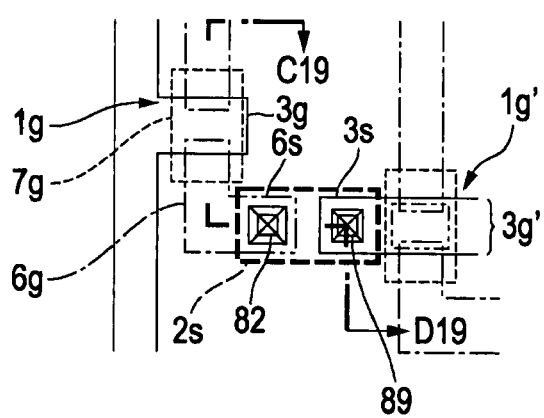

Hereinafter, embodiments of the invention will be described with reference to the attached drawings. In each view used for following description, the scale of each layer or each element is adjusted such that each layer or each element has a size capable of being easily identified in the view. In the following description, like reference numerals denote portions having common functions so as to clarify the correspondence with an example shown in FIG. 19.

Embodiment 1

Configuration of Liquid Crystal Apparatus

Figure 1A:
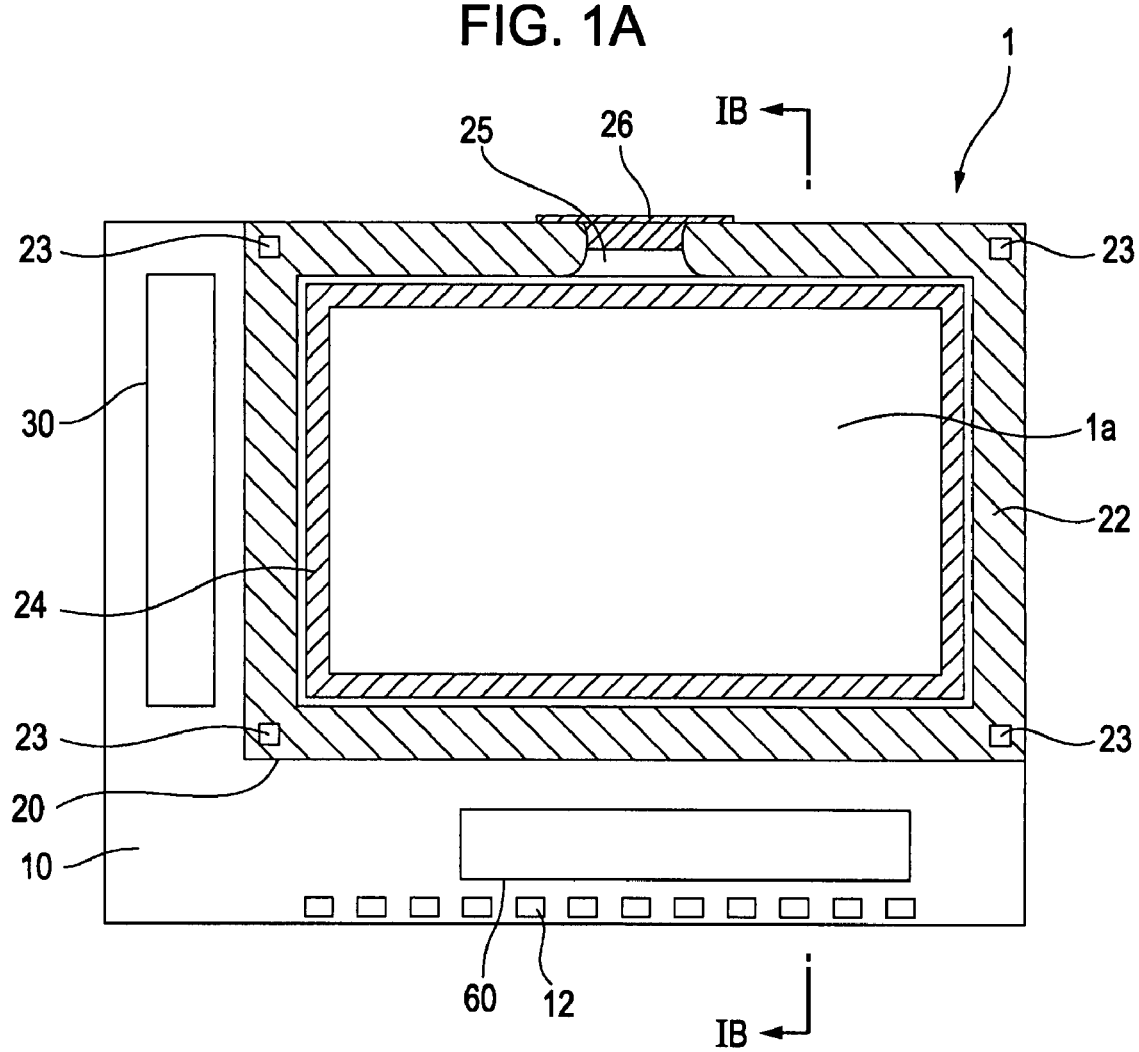
FIGS. 1a and 1b are respectively a plan view of a liquid crystal apparatus (electro-optical apparatus) together with components formed thereon when viewed from a counter substrate and a cross-sectional view taken along line 1B-1B.
Figure 1B:
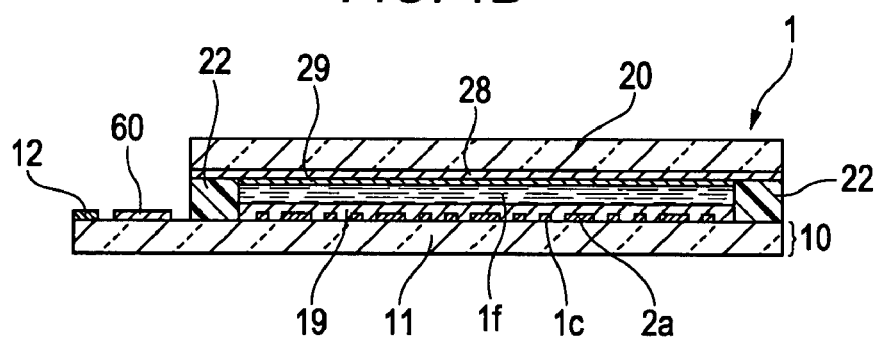

FIGS. 1a and 1b are respectively a plan view of a liquid crystal apparatus (electro-optical apparatus) together with components formed thereon when viewed from a counter substrate and a cross-sectional view taken along line 1B-1B. The liquid crystal apparatus 1 according to the present embodiment is a transmissive active-matrix liquid crystal display apparatus of a twisted nematic (TN) mode, an electrically controlled birefringence (ECB) mode or a vertical aligned nematic (VAN) mode. In the liquid crystal apparatus 1, a device substrate 10 and a counter substrate 20 are adhered through a seal material 22 and liquid crystal 1f is held therebetween as an electro-optical material.

In the present embodiment, as described below, an active layer of thin-film transistors formed on the device substrate 10 is formed of an amorphous silicon film. As shown in FIGS. 1a and 1b, on the device substrate 10, a data line driving circuit 60 and a scanning line driving circuit 30 including the thin-film transistors formed on the device substrate 10 are formed in edge regions located outside of the seal material 22.

Terminals 12 connected with a flexible wiring substrate are formed along the side of the substrate.

The seal material 22 is an adhesive formed of a thermosetting resin or photo-curing resin for adhering the device substrate 10 and the counter substrate 20 together at the circumference thereof and is mixed with gap materials such as glass fiber or glass beads for maintaining a gap between both of the substrates at a predetermined value. A liquid crystal injecting hole 25 is formed in the seal material 22 and is sealed by a sealing material 26 after the liquid crystal 1f is injected.

As described below in detail, thin-film transistors 1c or pixel electrodes 2a are formed on the device substrate 10 in a matrix and an alignment film 19 is formed on the surface of the device substrate. A frame 24 (not shown in FIG. 1b) formed of a light shielding material is formed on the counter substrate 20 inside of the seal material 22 and the inner side thereof is an image display region 1a. Although not shown in the counter substrate 20, a light shielding film called a black matrix or a black stripe is formed in regions facing horizontal and vertical boundary regions of each pixel and a counter electrode 28 and an alignment film 29 are formed above the light shielding film. Although not shown in FIG. 1b, on the counter substrate 20, RGB color filters and a protection film are formed in regions facing the pixels of the device substrate 10. Accordingly, the liquid crystal apparatus 1 can be used as a color display apparatus of an electronic apparatus such as a mobile computer, a mobile telephone or a liquid crystal television set.

As shown in FIG. 1a, a constant potential wiring (not shown) formed on the device substrate 10 and the counter electrode 28 of the counter substrate 20 are electrically connected by conductive materials 23 mixed in the seal material 22 between the device substrate 10 and the counter substrate 20.

Configuration of Device Substrate 10

Figure 2A:
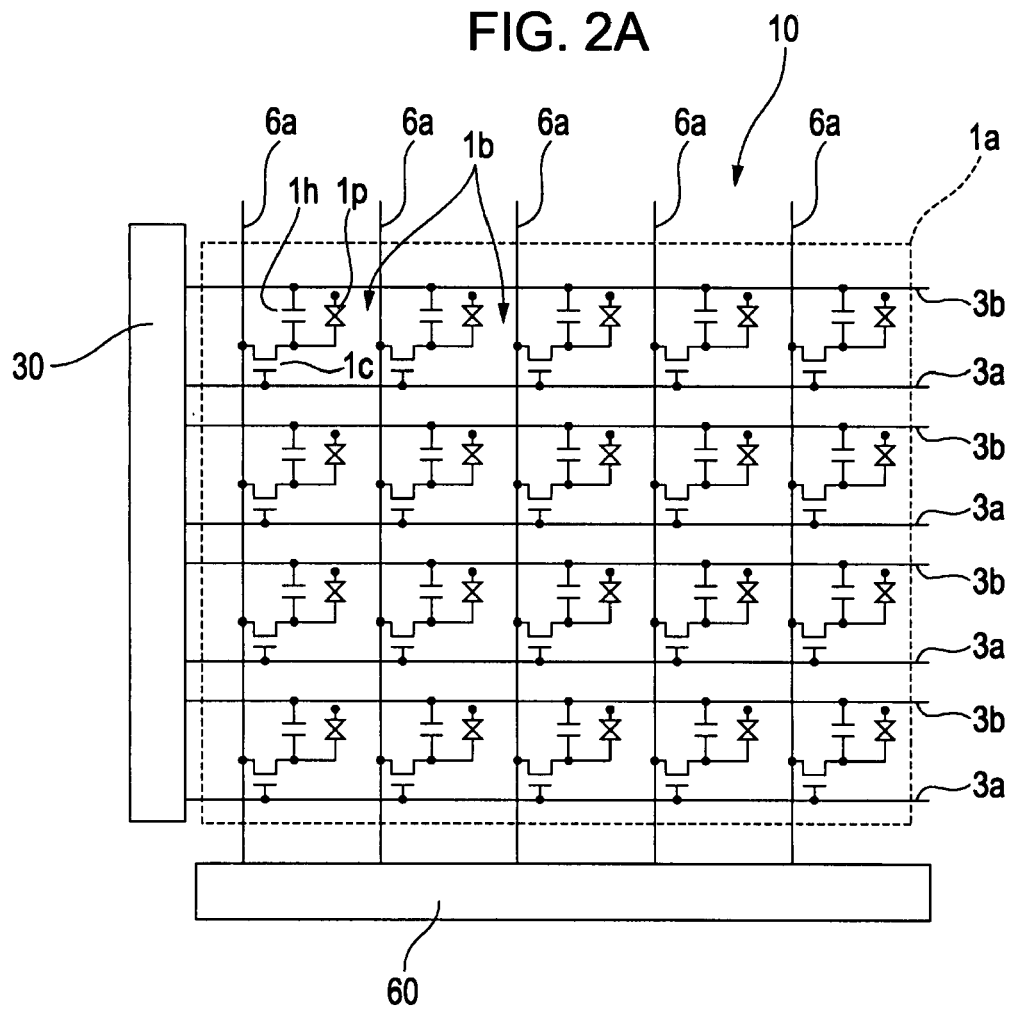
FIGS. 2a, 2b and 2c are respectively a view showing the electric configuration of a device substrate of the liquid crystal apparatus shown in FIG. 1, a schematic block diagram showing a portion of a driving circuit, and an equivalent circuit diagram of a thin-film transistor used in the driving circuit.
Figure 2B:
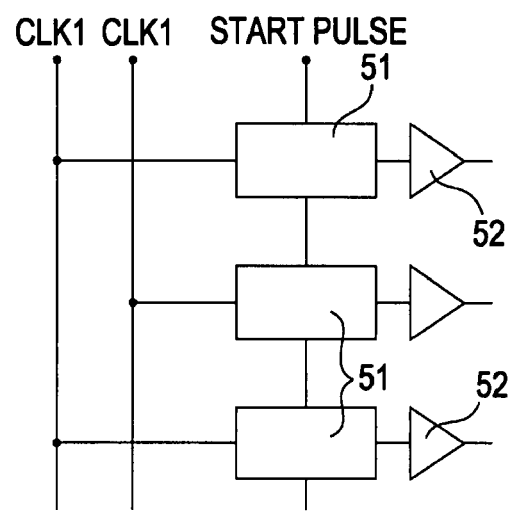
Figure 2C:
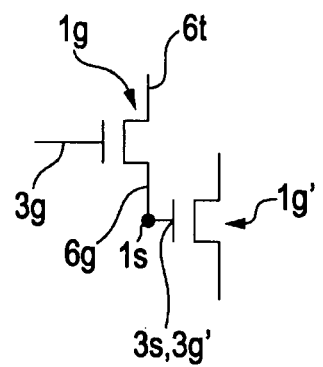

FIGS. 2a, 2b and 2c are respectively a view showing the electric configuration of the device substrate of the liquid crystal apparatus shown in FIG. 1, a schematic block diagram showing a portion of the driving circuit, and an equivalent circuit diagram of the thin-film transistor used in the driving circuit.

As shown in FIG. 2a, a plurality of source lines 6a (data lines) and gate lines 3a (scanning lines) are formed on the device substrate 10 to cross each other in a region corresponding to the image display region 1a and pixels 1b are arranged at positions corresponding to intersections between the lines. The gate lines 3a extend from the scanning line driving circuit 30 and the source lines 6a extend from the data line driving circuit 60. On the device substrate 10, the pixel-switching thin-film transistors 1c for controlling driving of the liquid crystal 1f are formed in the pixels 1b, the source lines 6a are electrically connected to the sources of the thin-film transistors 1c, and the gate lines 3a are electrically connected to the gates of the thin-film transistors 1c. On the device substrate 10, capacitive lines 3b are formed parallel to the gate lines 3a. In the present embodiment, liquid crystal capacitors 1p are connected to the thin-film transistors 1c between the counter substrate 20 and the device substrate in series and storage capacitors 1h are connected to the liquid crystal capacitors 1p in parallel. The capacitive lines 3b are connected to the scanning line driving circuit 30 and held at a constant potential. The storage capacitors 1h may be connected to previous-stage gate lines 3a and, in this case, the capacitive lines 3b may be omitted.

In the liquid crystal apparatus 1 having the above-described configuration, an image signal supplied to the source lines 6a is written into the liquid crystal capacitors 1p of the pixels 1b at a predetermined timing by turning on the thin-film transistors 1 for a predetermined period. The image signal having a predetermined level and written into the liquid crystal capacitors 1p is held for a predetermined period and the storage capacitors 1h prevent the image signal held in the liquid crystal capacitors 1p from leaking.

Configuration of Pixel

Figure 3A:
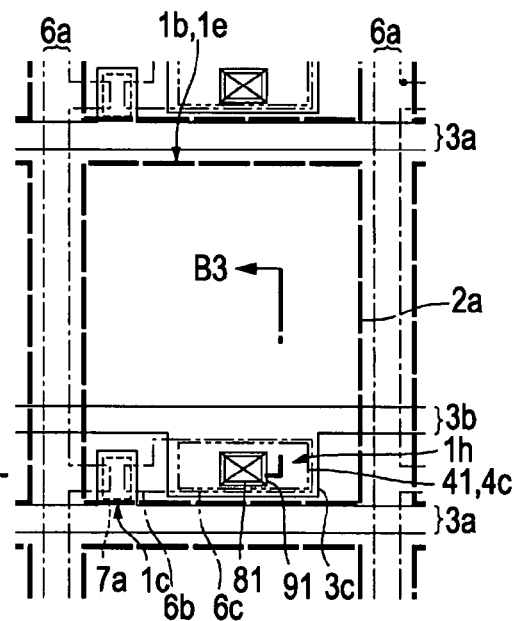
FIGS. 3a, 3b and 3c are respectively a plan view showing one pixel of a liquid crystal apparatus according to Embodiment 1 of the invention, a cross-sectional view taken along lines A3-B3 and C3-D3, and a plan view showing a thin-film transistor used in a driving circuit.
Figure 3B:
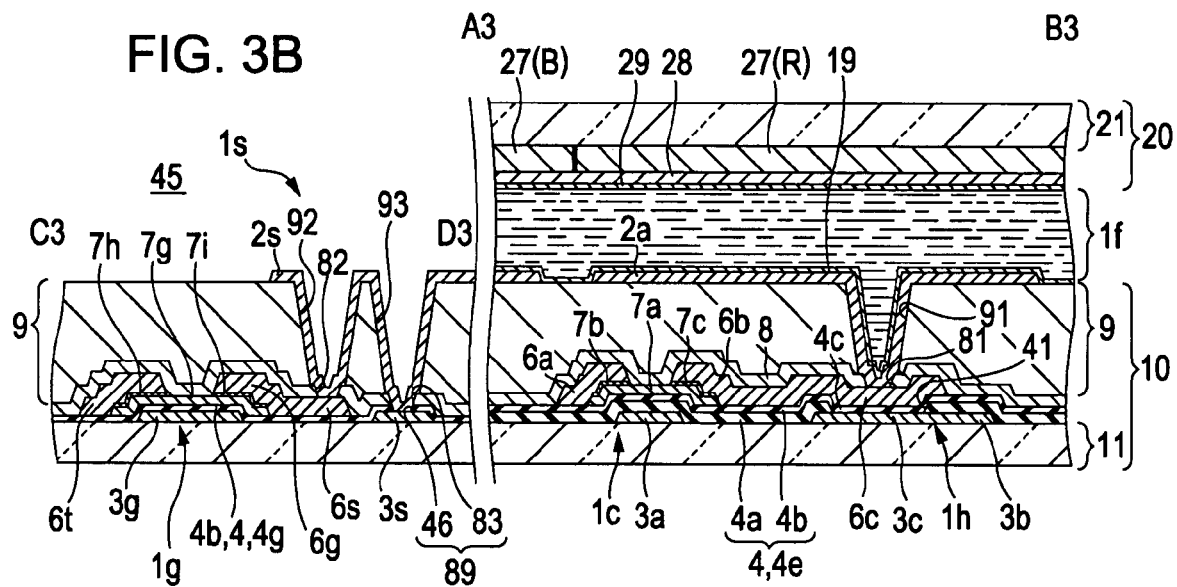
Figure 3C:
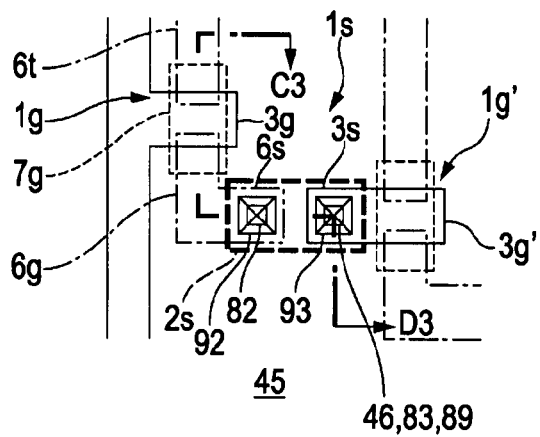

FIGS. 3a, 3b and 3c are respectively a plan view showing one pixel of the liquid crystal apparatus according to Embodiment 1 of the invention, a cross-sectional view taken along lines A3-B3 and C3-D3, and a plan view showing the thin-film transistor used in the driving circuit. In FIG. 3a, the pixel electrode is indicated by a thick elongated dotted-line, the gate line and the thin film which are simultaneously formed are indicated by a thin solid line, the source line and the thin film which are simultaneously formed are indicated by a dashed-dotted line, and a semiconductor film is indicated by a thin short dotted line. A removed portion of the insulating film is indicated by a dashed two-dotted line and the contact hole is indicated by the thin solid line similar to that indicating the gate line.

As shown in FIG. 3a, on the device substrate 10, the following elements for configuring the pixel 1b are formed in the pixel region 1e surrounded by the gate-line 3a and the source line 6a. First, an amorphous silicon film (semiconductor film) for configuring an active layer 7a (first active layer) of the bottom-gate thin-film transistor 1c (first thin-film transistor) is formed in the pixel region 1e. The gate electrode (first gate electrode) of the thin-film transistor 1c is formed by a portion protruding from the gate line 3a. With respect to the semiconductor film for configuring the active layer 7a, the source line 6a overlaps the end of the source side thereof as the source electrode and a drain electrode 6b overlaps the end of the drain side thereof. In addition, the capacitive line 3b is formed parallel to the gate line 3a.

The storage capacitor 1h having a protruding portion of the capacitive line 3b serving as a lower electrode 3c and an extending portion of the drain electrode 6b serving as an upper electrode 6c is formed in the pixel region 1e. The upper electrode 6c is electrically connected to the pixel electrode 2a formed of an indium tin oxide (ITO) film through contact holes 81 and 91.

The cross-sectional view taken along line A3-B3 in the device substrate 10 having the above-described configuration is shown in FIG. 3b. First, on an insulating substrate 11 formed of a glass substrate or a quartz substrate, the gate line 3a and the capacitive line 3b (the lower electrode 3c of the storage capacitor 1h) are formed. In the present embodiment, both the gate line 3a and the capacitive line 3b have a two-layer structure having an aluminum alloy film containing neodymium and having a thickness of 150 nm and a molybdenum film laminated on the aluminum alloy film and having a thickness of 20 nm.

The insulating film 4 is formed on the gate line 3a to cover the gate line 3a. On the insulating film 4, the semiconductor film for configuring the active layer 7a of the thin-film transistor 1c is formed in a region which partially overlaps the protruding portion (gate electrode) of the gate line 3a. In the semiconductor film for configuring the active layer 7a, an ohmic contact layer 7b formed of a doped silicon film and the source line 6a are laminated on a source and an ohmic contact layer 7c formed of a doped silicon film and the drain electrode 6b are formed on a drain, thereby configuring the thin-film transistor 1c. The upper electrode 6c, which is the storage capacitor 1h, is formed by an extending portion of the drain electrode 6b. In the present embodiment, the active layer 7a is formed of an intrinsic amorphous silicon film having a thickness of 150 nm and the ohmic contact layers 7b and 7c are formed of an N+-type amorphous silicon film doped with phosphorous and having a thickness of 50 nm. Both the source line 6a and the drain electrode 6b (the upper electrode 6c) have a three-layer structure in which a molybdenum film having a thickness of 5 nm, an aluminum film having a thickness of 1500 nm and a molybdenum film having a thickness of 50 nm are laminated from a lower layer side to an upper layer side.

A passivation film 8 (interlayer insulating film) formed of a silicon nitride film and a planarization film 9 formed of a photosensitive resin layer such as acrylic resin are formed on the source line 6a, the drain electrode 6b and the upper electrode 6c and the pixel electrode 2a is formed on the planarization film 9. The pixel electrode 2a is electrically connected to the upper electrode 6c through the contact hole 91 formed in the planarization film 9 and the contact hole 81 (the contact hole for connecting the pixel electrode) formed in the passivation film 8 and is electrically connected to the drain of the thin-film transistor 1c through the upper electrode 6c and the drain electrode 6b. An alignment film 19 is formed on the surface of the pixel electrode 2a. In the present embodiment, the passivation film 8 is formed of a silicon nitride film having a thickness of 250 nm and the pixel electrode 2a is formed of an ITO film having a thickness of 100 nm.

The counter substrate 20 is arranged to face the device substrate 10 having the above-described configuration and the liquid crystal 1f is held between the device substrate 10 and the counter substrate 20. On the counter substrate 20, color filters 27 of different colors, the counter electrode 28, and the alignment film 29 are formed and the liquid crystal capacitor 1p (see FIG. 2) is formed between the pixel electrode 2a and the counter electrode 28. The black matrix or the protection film may be formed on the counter substrate 20, but is not shown.

Configuration of Driving Circuits

FIG. 4 is a view illustrating a variety of examples of the driving circuits or the contact portion. In the liquid crystal apparatus 1 according to the present embodiment, the data line driving circuit 60 and the scanning line driving circuit 30 including gate circuits 51 or buffer circuits 52 shown in FIG. 2b are configured on the device substrate 10 in the outer region of the pixel region 1e (the outer region of the image display region 1a). In the driving circuits, as shown in FIG. 2c, a plurality of thin-film transistors 1g and 1g' (second thin-film transistor) and a contact portion is electrically connected to the thin-film transistors 1g and 1g' are configured.

The thin-film transistors 1g and 1g' shown herein have the same basic structure. The cross-sectional view taken along line C3-D3 in the device substrate 10 is shown in the left side of FIG. 3b. On the insulating substrate 11, a signal line 3g having a protruding portion as the gate electrode (second gate electrode) of the thin-film transistor 1g is formed. In the present embodiment, the signal line 3g has a two-layer structure having an aluminum alloy film containing neodymium and having a thickness of 150 nm and a molybdenum film laminated on the aluminum alloy film and having a thickness of 20 nm, similar to the gate line 3a and the capacitive line 3b.

The insulating film 4 is formed on the gate line 3a. On the insulating film 4, the amorphous silicon film (semiconductor film) for configuring the active layer 7g of the thin-film transistor 1g is formed in a region which partially overlaps the protruding portion (second gate electrode) of the signal line 3g. In the semiconductor film for configuring the active layer 7g, an ohmic contact layer 7h formed of a doped silicon film and a signal line 6t are laminated on a source and an ohmic contact layer 7i formed of a doped silicon film and a drain wiring 6g are formed on a drain, thereby configuring the thin-film transistor 1g. An upper conductive layer 6s is formed by an extending portion of the drain wiring 6g. In the present embodiment, similar to the thin-film transistor 1c, the active layer 7g is formed of an intrinsic amorphous silicon film having a thickness of 150 nm and the ohmic contact layers 7h and 7i are formed of an N+-type amorphous silicon film doped with phosphorous and having a thickness of 50 nm. The signal line 6t, the drain wiring 6g and the upper conductive layer 6s have a three-layer structure in which a molybdenum film having a thickness of 5 nm, an aluminum film having a thickness of 1500 nm and a molybdenum film having a thickness of 50 nm are laminated from a lower layer side to an upper layer side, similar to the source line 6a and the drain electrode 6b (upper electrode 6c).

The passivation film 8 (interlayer insulating film) formed of a silicon nitride film and the planarization film 9 formed of a photosensitive resin layer such as acrylic resin are formed on the signal line 6t, the drain wiring 6g and the upper conductive layer 6s.

The drain wiring 6g of the thin-film transistor 1g and a gate wiring 3g' of a next-stage thin-film transistor 1g' are electrically connected to the contact portion 1s. In the contact portion 1s, a contact hole 93 which penetrates through the planarization film 9 and a contact hole 82 (the upper conductive layer for connecting the contact hole) which penetrates through the passivation film 8 are formed above the upper conductive layer 6s, and a contact hole 93 which penetrates through the planarization film 9 and a contact hole 89 (the contact hole for connecting the lower conductive layer) which penetrates through the passivation film 8 and the insulating film 4 are formed above the lower conductive layer 3s formed of an extending portion of the gate wiring 3g'. Here, the contact hole 89 is formed of an upper hole 83 which penetrates through the passivation film 8 and a lower hole 46 which penetrates through the insulating film 4. A conductive pattern 2s formed of an ITO film is formed on the planarization film 9. The conductive pattern 2s is electrically connected to the upper conductive layer 6s through the contact holes 82 and 92 and is electrically connected to the lower conductive layer 3s through the contact holes 89 and 93. The upper conductive layer 6s and the lower conductive layer 3s are electrically connected to the conductive pattern 2s through the contact holes 82, 89, 92 and 93.

Figure 4A:
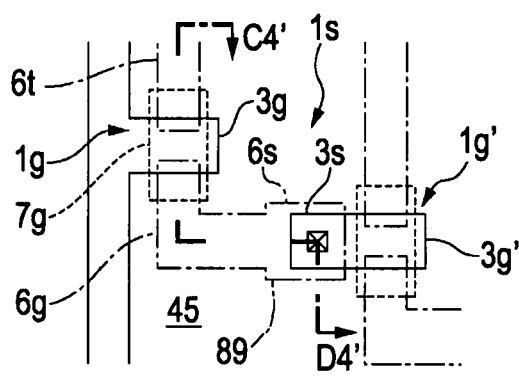
FIG. 4 is a view illustrating a driving circuit or a contact portion configured in the liquid crystal apparatus according to the invention.
Figure 4B:
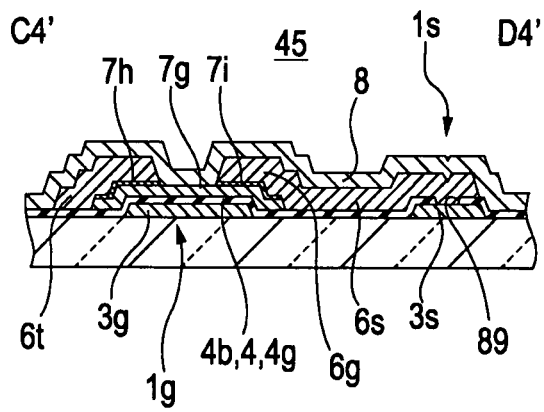
Figure 4C:
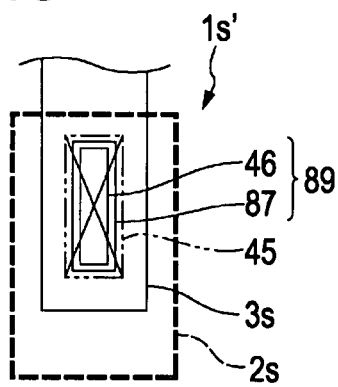
Figure 4D:
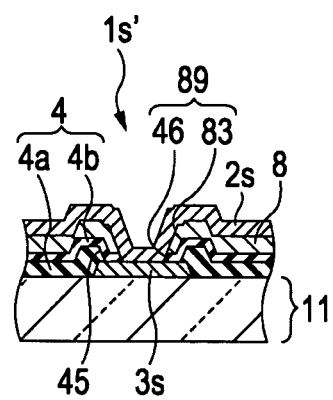

In electrically connecting the drain wiring 6g and the gate wiring 3g', like the contact portion 1s shown in FIGS. 4a and 4b, the extending portion (the upper conductive layer 6s) of the drain wiring 6g and the extending portion (the lower conductive layer 3s) of the gate wiring 3g' may be directly and electrically connected through the contact hole 89.

In the liquid crystal apparatus 1, a variety of contact portions are configured. For example, in the contact portion 1s' shown in FIGS. 4c and 4d, a terminal 12 shown in FIGS. 1a and 1b is formed on the device substrate 10 and the conductive pattern 2s simultaneously formed with the pixel electrode 2a is electrically connected to the lower conductive layer 3s simultaneously formed with the gate line 3a through the contact hole 89 which penetrates through the passivation film 8 and the insulating film 4, thereby configuring the terminal 12 with the conductive pattern 2s.

Figure 4E:
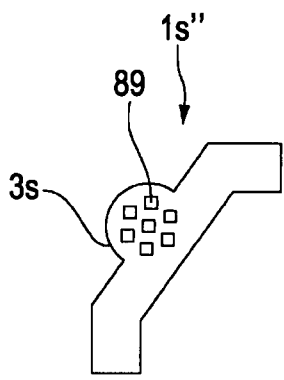
Figure 4F:
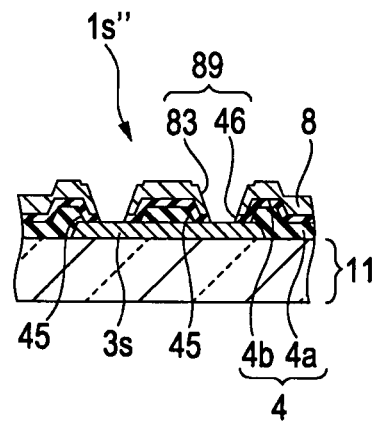

The contact portion 1s'" shown in FIGS. 4e and 4f is a portion for electrically connecting the counter electrode 28 of the counter substrate 20 through a conductive material 23 shown in FIG. 1a to the lower conductive layer 3s simultaneously formed with the gate line 3a, and the upper side of the lower conductive layer 3s is opened by the contact hole 89 which penetrates through the passivation film 8 and the insulating film 4 such that the lower conductive layer 3s and the counter electrode 28 of the counter substrate 20 are electrically connected by the conductive material 23 interposed in the contact hole 89.

The configurations of the contact holes 1s, 1s' and 1s" shown in FIGS. 4a to 4f can be realized by modifying the configuration of the contact hole is shown in FIGS. 3b and 3c and thus the configuration of the contact portion is shown in FIGS. 3b and 3c will now be described.

Detailed Configuration of Gate Insulating Layer, Dielectric Layer and Contact Portion In FIG. 3b, on the device substrate 10 used, in the liquid crystal apparatus 1 according to the present embodiment, a lower insulating film 4a formed of a lower thick silicon nitride film and an upper insulating film 4b formed of an upper thin silicon nitride film are formed between the conductive film for configuring the gate line 3a and the semiconductor film for configuring the active layer 7a such that the gate insulating layer 4e of the thin-film transistor 1c has a two-layer structure including the lower insulating layer 4a and the upper insulating layer 4b. Here, the sum of the thicknesses of the lower insulating film 4a and the upper insulating layer 4b can ensure a high gate withstanding voltage in the thin-film transistor. The thicknesses of the lower insulating film 4a and the upper insulating layer 4b are set such that parasitic capacitance is suppressed and the thickness of the upper insulating film 4b is smaller than that of the lower gate insulating film 4a. For example, the thickness of the lower gate insulating layer 4a is 250 to 500 nm and more preferably 30 nm and the thickness of the upper insulating film 4b is 50 to 200 nm and more preferably 100 nm. The thicknesses are optimized and determined in consideration of the writing capability of the thin-film transistor 1c, the parasitic capacitance and the balance of the storage capacitor 1h. For example, in a case of a structure having pixels having a small dimension and formed with high precision (for example, a short side of one pixel has a length of 40 µm or less), the values of the subsidiary capacitor 1h and the liquid crystal capacitor 1p of the pixel 1b are decreased, but a minimum dimension of the thin-film transistor 1c is defined by the resolution of photolithography. Accordingly, in the high-precision pixel, a ratio of the parasitic capacitance of the thin-film transistor 1c to the entire capacitance of one pixel is increased. When the ratio of the parasitic capacitance (hereinafter, referred to as parasitic capacitance ratio) is increased, display quality deteriorates in the liquid crystal apparatus 1 with the occurrence of, for example, flicker, crosstalk, and burn-in. Accordingly, the pixel is generally designed such that the parasitic capacitance ratio is decreased as much as possible. However, when the parasitic capacitance ratio is restricted by the high-precision layout, it is impossible to realize improvement using a known method. However, when the structure and the process according to the present invention is used, the thickness of the gate insulating film of the thin-film transistor 1c can be set independently of the subsidiary capacitor 1h. That is, in the high-precision pixel, the parasitic capacitance of the thin-film transistor 1c can be reduced and thus the parasitic capacitance ratio can be reduced by increasing the thickness of the gate insulating film to a greater extent than under a standard condition. In such a condition, the current driving capability (capability for writing a signal to the pixel) of the thin-film transistor 1c deteriorates, but the value of the pixel capacitor 1h is reduced. Thus, the high-precision pixel can be designed such that no problem is caused in the writing capability although the thickness of the gate insulating film is increased.

In the present embodiment, in a driving circuit forming region, a removed region 45 in which the lower insulating film 4a is removed over the thickness direction is formed over a wide region including a region which overlaps the protruding portion (gate electrode) of the signal line 3g of the thin-film transistor 1g. In the removed region 45, only the thin upper insulating film 4b is formed as the insulating film 4. Accordingly, the gate insulating film 4g of the thin-film transistor 1g includes the upper insulating film 4b. In the contact portion is, the region in which the contact hole 89 is formed is located at the removed region 45 in which the lower insulating film 4a is removed over the thickness direction, and the lower hole 46 penetrates through only the upper insulating film 4b.

In the present embodiment, in a region which overlaps the lower electrode 3c of the storage capacitor 1h in a plane, a removed region 41 in which the lower insulating film 4a is removed over the thickness direction and the dielectric layer 4c includes only the upper insulating-film 4b. Here, a thick portion having the same thickness as the insulating film 4 remains above the lower electrode 3c along the edge of the lower electrode 3c and the dielectric layer 4c is surrounded by the thick insulating film. Accordingly, it is possible to prevent the reduction of a withstanding voltage which is apt to be generated in the edge of the upper electrode 6c or the edge of the lower electrode 3c.

Method of Manufacturing Liquid Crystal Apparatus 1

FIGS. 5a to 5g and FIGS. 6a to 6e are cross-sectional views showing a method of manufacturing a device substrate 10 used in the liquid crystal apparatus 1 according to the present embodiment. In order to manufacture the device substrate 10, the following process is performed on a large-sized substrate having a plurality of device substrates and the large-sized substrate will be described as the device substrate 10 in the following description.

Figure 5A:
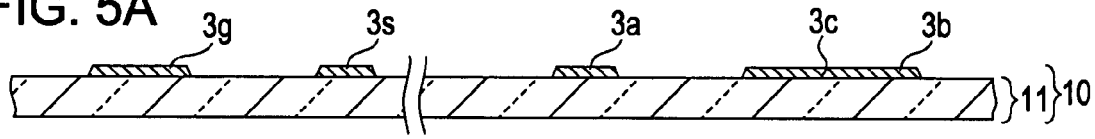
FIGS. 5a to 5g are cross-sectional views showing a method of manufacturing a device substrate used in the liquid crystal apparatus shown in FIG. 3.

First, in a process of forming a gate electrode shown in FIG. 5a, a metal film (a laminated film having an aluminum alloy film having a thickness of 150 nm and a molybdenum film having a thickness of 20 nm) is formed on the surface of a large-sized insulating substrate 11 such as a glass substrate and the metal film is patterned using photolithography such that a gate line 3a (gate electrode), a capacitive line 3b (lower electrode 3c), a signal line 3g (gate electrode) and a lower conductive layer 3s are simultaneously formed.

Figure 5B:
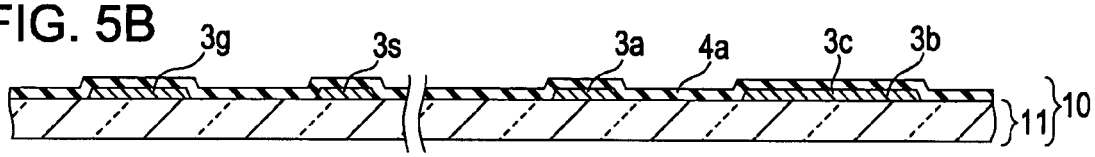

Next, as shown in FIG. 5b, in a process of forming a gate insulating layer (process of forming a lower insulating film), a thick lower insulating film 4a for configuring a lower layer of an insulating film 4 is formed by a plasma CVD method. In the present embodiment, the lower insulating film 4a is formed of a silicon nitride film having a thickness of about 300 nm.

Figure 5C:
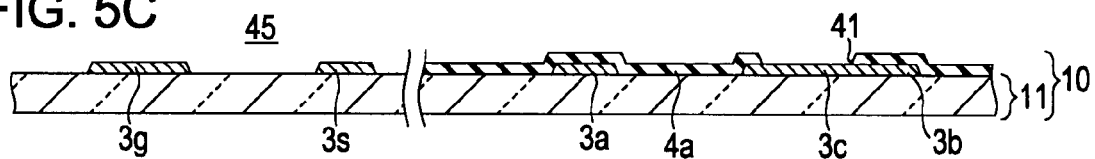

Next, in a thinning process shown in FIG. 5c, a resist mask (not shown) including openings in a region which overlaps the lower electrode 3c in a plane and a region in which the signal line 3g or the lower conductive layer 3s are formed is formed using photolithography and the lower insulating film 4a is subjected to reactive ion etching (dry etching) using fluorinated etching gas such as $SF_6$, such that removed regions 41 and 45 are formed. Since reactive ion etching uses a synergic effect of the physical sputter effect of an ion and the chemical etching effect of a radical, anisotropy is excellent and high productivity is obtained.

Figure 5D:
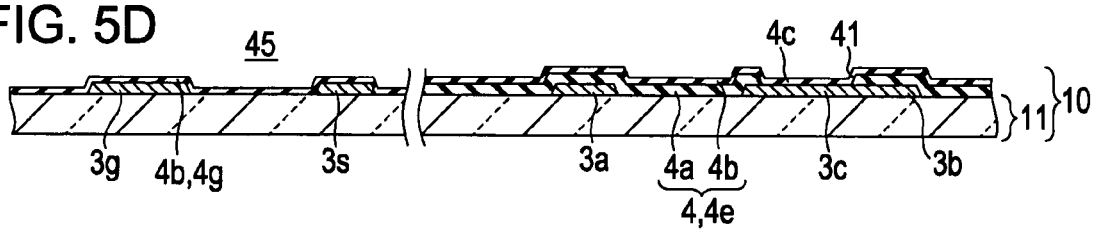

Next, in a process of forming a gate insulating layer shown in FIG. 5d (process of forming an upper insulating film), a thin upper insulating film 4b for configuring an upper layer of the insulating film 4 is formed by the plasma CVD method. In the present embodiment, the upper insulating film is formed of a silicon nitride film having a thickness of about 100 nm. As a result, the insulating film 4 including the thick lower insulating film 4a and the thin upper insulating film 4b is formed on the gate line 3a (gate electrode). In the removed region 45, the gate insulating layer 4g including only the upper insulating film 4b is formed on the signal line 3g and the lower conductive layer 3s is covered by only the upper insulating film 4b. In the removed region 41, the dielectric layer 4c including only the upper insulating film 4b is formed on the lower electrode 3c.

Figure 5E:
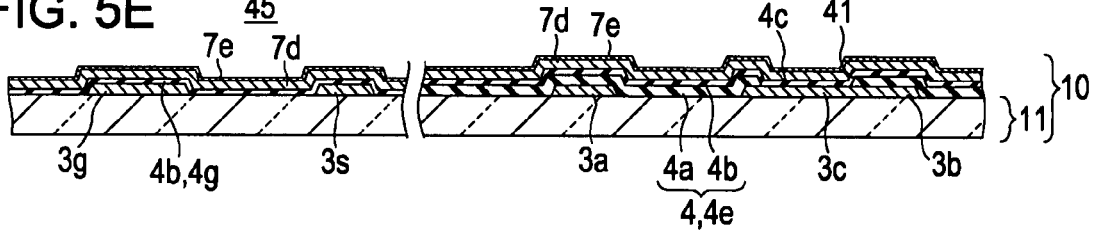

Next, in a process of forming a semiconductor film shown in FIG. 5e, an intrinsic amorphous silicon film 7d having a thickness of 150 nm and an $N^+$-type silicon film 7e having a thickness of 50 nm are sequentially formed by the plasma CVD method. At this time, while the device substrate 10 which is subjected to the process of forming the upper insulating film shown in FIG. 5d is maintained in a vacuum atmosphere, the process of forming the semiconductor film shown in FIG. 5e is performed such that the device substrate 10 does not contact air. Accordingly, the amorphous silicon film 7d can be laminated in a state that the surface of the insulating film 4 (upper insulating film 4b) is clean.

Figure 5F:
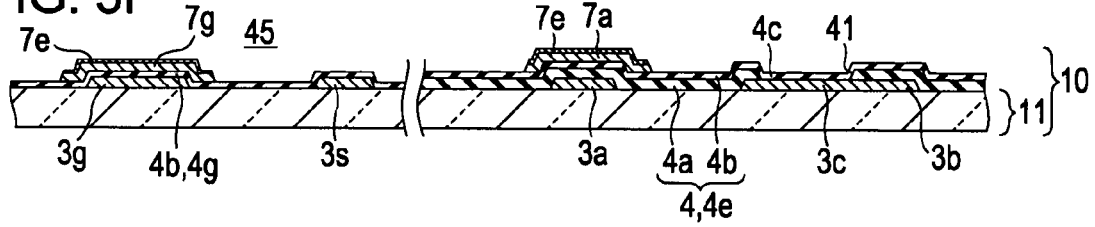

Next, as shown in FIG. 5f, the amorphous silicon film 7d and the $N^+$-type silicon film 7e are etched using photolithography to form island-shaped active layers 7a and 7g and an island-shaped $N^+$-type silicon film 7e. In this etching, reactive ion etching (dry etching) using fluorinated etching gas such as $SF_6$ is performed.

Figure 5G:
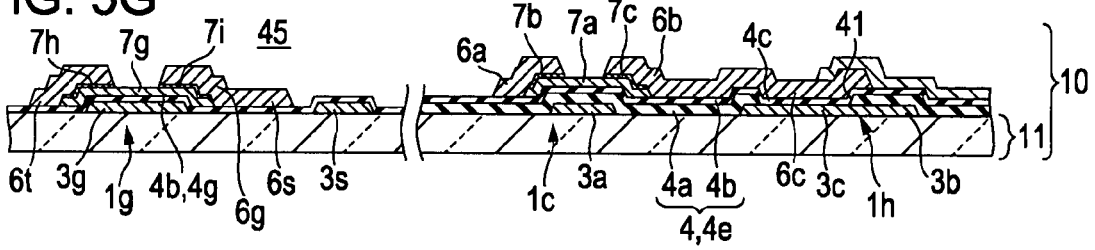

Next, in a process of forming a source and drain electrode shown in FIG. 5g, a metal film (a laminated film including a molybdenum film having a thickness of 5 nm, an aluminum film having a thickness of 150 nm and a molybdenum film having a thickness of 50 nm) is formed and patterned using photolithography such that a source line 6a, a drain electrode 6b (upper electrode 6c), a signal line 6t and a drain wiring 6g (upper conductive layer 6s) are formed. Subsequently, the $N^+$-type silicon film 7e between the source line 6a and the drain electrode 6b is removed by etching using the source line 6a and the drain electrode 6b as a mask and the $N^+$-type silicon film 7e between the signal line 6t and the drain wiring 6g is removed by etching using the signal line 6t and the drain wiring 6g as a mask, thereby dividing the source and drain electrode. As a result, ohmic contact layers 7b, 7c, 7h and 7i are formed. At this time, a portion of the surface of the active layers 7a and 7g is etched. Accordingly, the bottom-gate pixel-switching thin-film transistors 1c and 1g are formed and the storage capacitor 1h is formed.

Next, in a process of forming an interlayer insulating film shown in FIG. 6, a passivation film 8 formed of a silicon nitride film having a thickness of 250 nm is formed by the plasma CVD method.

Figure 6A:
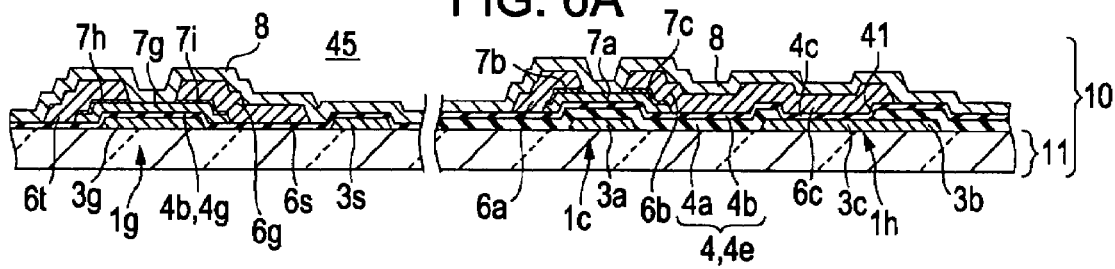
FIGS. 6a to 6e are cross-sectional views showing the method of manufacturing the device substrate used in the liquid crystal apparatus shown in FIG. 3.
Figure 6B:
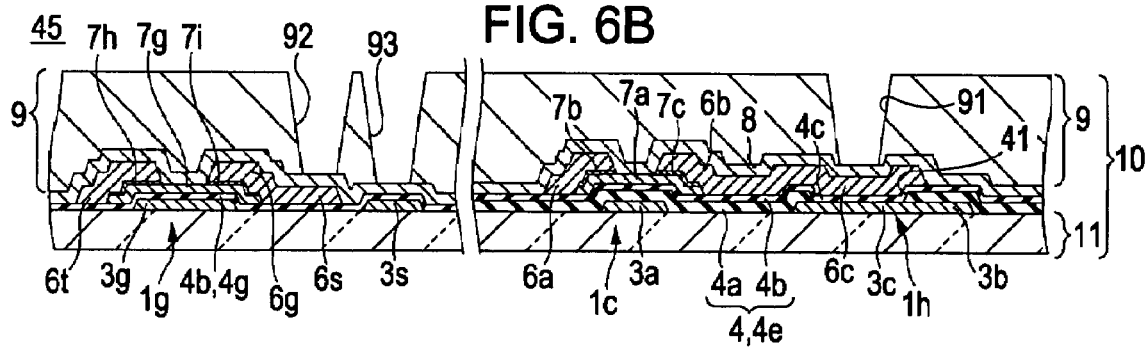

Next, in a process of forming a planarization film shown in FIG. 6b, photosensitive resin such as acrylic resin is coated by a spin coating method and exposed and developed such that a planarization film 9 including contact holes 91, 92 and 93 is formed.

Figure 6C:
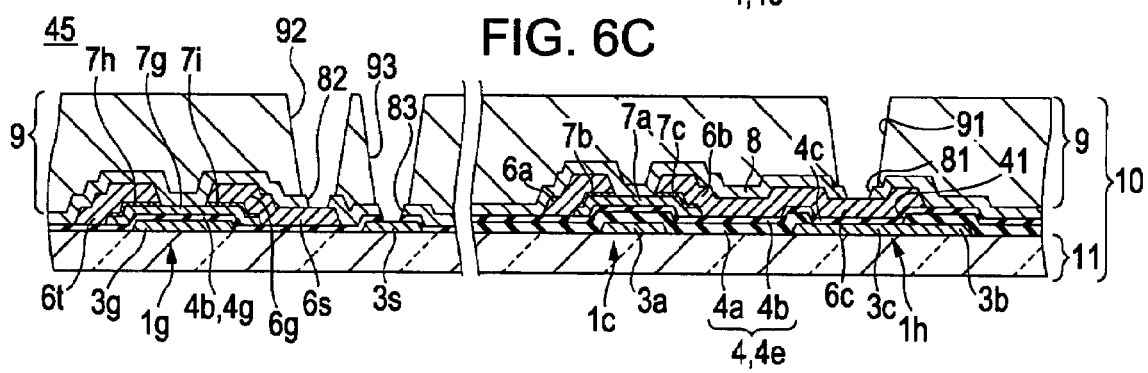

Next, in a process of forming the contact holes shown in FIG. 6c, the passivation film 8 is etched using photolithography to form the contact holes 81, 82 and 89. In this etching, reactive ion etching (dry etching) using fluorinated etching gas such as $SF_6$ is performed.

At this time, since the contact holes 81 and 82 penetrate through the passivation film 8, the contact holes 81 and 82 are simultaneously formed. However, since the contact hole 89 for connecting the lower conductive layer needs to penetrate through the passivation film 8 and the insulating film 4, only an upper hole 83 penetrating through the passivation film 8 of the contact hole 89 for connecting the lower conductive layer is formed.

Figure 6D:
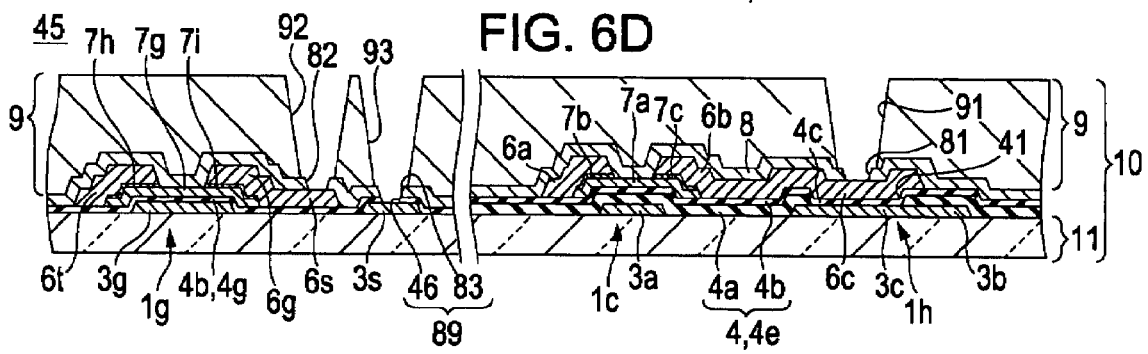

Accordingly, in the process of forming the contact holes, the insulating film 4 (upper insulating film 4b) located at the bottom of the upper hole 83 is removed by forming another resist mask using photolithography, as shown in FIG. 6d. As a result, a lower hole 46 is formed in the insulating film 4 and the contact hole 89 reaches the lower conductive layer 3s. In this etching, reactive ion etching (dry etching) using fluorinated etching gas such as $SF_6$ is performed.

Figure 6E:
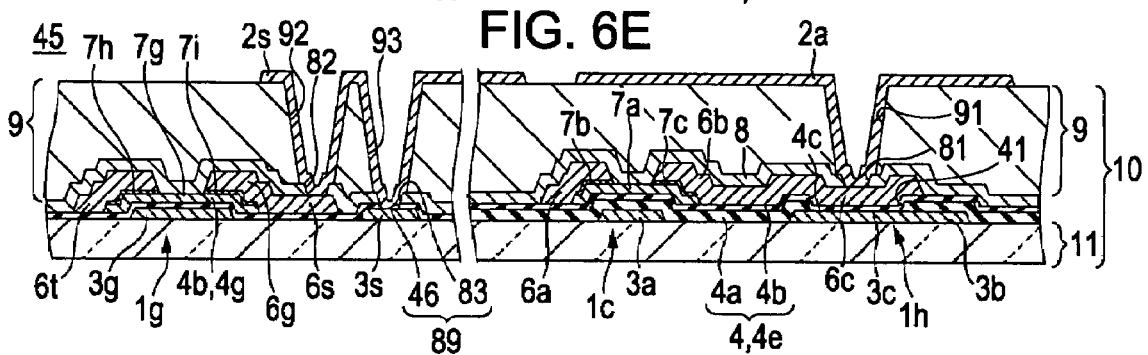

Next, in a process of forming a pixel electrode shown in FIG. 6e, an ITO film having a thickness of 100 nm is formed by a sputtering method and patterned by photolithography and wet etching to form a pixel electrode 2a and a conductive pattern 2s. As a result, the pixel electrode 2a is electrically connected to the upper electrode 6c through the contact hole 81. The conductive pattern 2s is electrically connected to the upper conductive layer 6s and the lower conductive layer 3s through the contact holes 82 and 89. Subsequently, a polyimide film for forming an alignment film 19 shown in FIG. 3 is formed and is subjected to a rubbing treatment.

In the large-sized substrate state, the device substrate 10 on which a variety of wirings or TFTs is formed is adhered with a large-sized counter substrate 20, which is separately formed, using a seal material 22 and is cut to a predetermined size. Accordingly, since a liquid crystal injecting hole 25 is opened, liquid crystal 1f is injected between the device substrate 10 and the counter substrate 20 through the liquid crystal injecting hole 25 and the liquid crystal injecting hole 25 is sealed by a sealing material 26.

Main Effect of the Present Embodiment

As described above, in the liquid crystal apparatus 1 according to the present embodiment, since the gate electrodes (the gate line 3a and the signal line 3g) and the active layers 7a and 7g of the thin-film transistor 1c and the thin-film transistor 1g are simultaneously formed and a portion of the gate insulating layers 4e and 4g are the same, the method of processing the thin-film transistors 1c and 1g can be the same. Since the thickness of the gate insulating layer 4g of the thin-film transistor 1g is smaller than that of the gate insulating layer of the thin-film transistor 1c, a high gate withstanding voltage can be ensured with respect to the thin-film transistor 1c and ON current characteristics can be improved with respect to the thin-film transistor 1g.

Since the insulating film 4 is used as the dielectric layer 4c of the storage capacitor 1h by decreasing the thickness of the insulating film 4, it is possible to increase capacitance per unit area of the storage capacitor 1h by reducing the gate withstanding voltage of the thin-film transistor 1c. In addition, since the upper insulating film 4b for configuring the dielectric layer 4c is the silicon nitride film (having a specific permittivity of about 7 to 8) and has permittivity higher than that of a silicon oxide film, the storage capacitor 1h has high capacitance per unit area. Therefore, the storage capacitor 1h has high charge holding characteristics. In addition, when the occupying area thereof is decreased as the capacitance value per unit area is increased, a pixel aperture ratio can be increased.

According to the present embodiment, since the thickness of the gate insulating layer of the thin-film transistor 1c can be set independent of the storage capacitor 1h, the parasitic capacitance of the thin-film transistor 1c can be reduced and a parasitic capacitance ratio can be reduced. Therefore, in the liquid crystal apparatus 1, it is possible to prevent the deterioration of the display quality resulting from, for example, flicker, crosstalk and burn-in.

In the present embodiment, when a partially thin portion of the insulating film 4 is used as the gate insulating layer 4g and the dielectric layer 4c, since the gate insulating layer 4g and the dielectric layer 4c are formed of only the upper insulating film 4b without leaving the lower insulating film 4a, it is possible to prevent a variation in capacitance of the storage capacitor 1h or a variation in electric characteristics of the thin-film transistor 1g due to a variation in etching depth, unlike a case where the lower insulating film 4a partially remains. In addition, in the present embodiment, when a partially thin portion of the insulating film 4 is used as the gate insulating layer 4g and the dielectric layer 4c, the lower insulating layer 4a between the lower insulating film 4a and the upper insulating film 4b is removed such that the upper insulating film 4b formed on the lower insulating film 4a is used as the gate insulating layer 4g and the dielectric layer 4c. Since the upper insulating film 4b is not exposed to static electricity or plasma when removing the lower insulating film 4a by the dry etching, the defect density of the upper insulating film 4b is low. Therefore, it is possible to prevent the generation of problems such as the reduction of the withstanding voltage of the storage capacitor 1h.

Although the removed regions 41 and 45 are formed by dry etching the lower insulating film 4a in the present embodiment, the removed regions 41 and 45 may be formed by wet etching. Even in this case, since the upper insulating film 4b does no contact an etchant of the lower insulating film 4a, a pinhole is not formed in the upper insulating film 4b. Therefore, it is possible to prevent a variation in withstanding voltage of the storage capacitor 1h or the thin-film transistor 1g.

In the present embodiment, when the insulating film is thinned, the insulating film 4 is thinned even in a region in which the contact hole 89 will be formed. Accordingly, when the contact hole 89 is formed in the process of forming the contact hole, the thickness of the insulating film 4 which remains at a time of forming the upper hole 83 is small. Accordingly, since a time necessary for etching the insulating film 4 is short when the contact hole 89 is formed up to the lower conductive layer 3s, it is possible to improve throughput. Although dry etching is employed at the time of forming the contact hole 89, the thickness of the insulating film 4 in which the contact hole 89 is formed is small. Accordingly, since a time that the gate insulating layers 4e and 4g are exposed to the static electricity or plasma is decreased as a dry etching time is decreased, it is possible to prevent the generation of defect in the insulating film 4. Therefore, even when the thickness of the gate insulating layer 4g or the dielectric layer 4c is decreased, it is possible to prevent the generation of insulation breakdown (short-circuit) or the reduction of the withstanding voltage of the storage capacitor 1h or the thin-film transistor 1g.

In the present embodiment, since the intrinsic amorphous silicon film 7d for configuring the upper insulating film 4b and the active layers 7a and 7g and the N$^+$-type silicon film 7e for configuring the ohmic contact layers 7b and 7c are sequentially formed, it is possible to form the amorphous silicon film 7d on the clean upper insulating film 4b. In the present embodiment, when the upper insulating film 4b, the amorphous silicon film 7d and the ohmic contact layers 7b and 7c are formed, the device substrate 10 is continuously maintained in the vacuum atmosphere. Accordingly, it is possible to reliably prevent the contamination of the surface of the upper insulating film 4b. Therefore, the interface between the insulating film 4 and the active layer 7a is clean and thus the reliability of the thin-film transistor 1c is high.

Modified Example 1 of Embodiment 1

Although, in Embodiment 1, the upper hole 83 of the contact hole 89 is formed in the process of forming the contact hole shown in FIG. 6c and the insulating film 4 (the upper insulating film 4b) located at the bottom of the upper hole 83 is removed to form the lower hole 46 in the other etching process, when the thicknesses of the upper electrode 6c and the upper conductive layer 6s are large and the thickness of the insulating film 4 in which the contact hole 89 for connecting the lower conductive layer is formed is small, the contact holes 81, 82 and 89 may simultaneously formed in the process of forming the contact holes. The present embodiment is not limited to Embodiment 1 and is applicable to the following embodiments.

Modified Example 2 of Embodiment 1

Figure 7A:
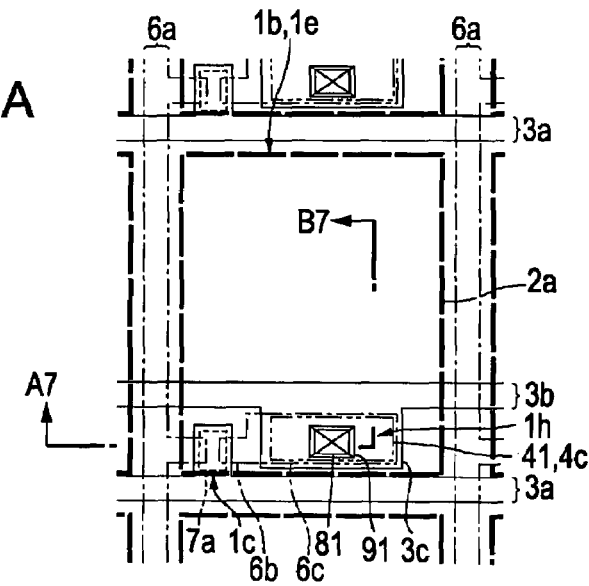
FIGS. 7a, 7b and 7c are respectively a plan view showing one pixel of a liquid crystal apparatus according to a modified example of Embodiment 1 of the invention, a cross-sectional view taken along lines A7-B7 and C7-D7, and a plan view showing a thin-film transistor used in a driving circuit.
Figure 7B:
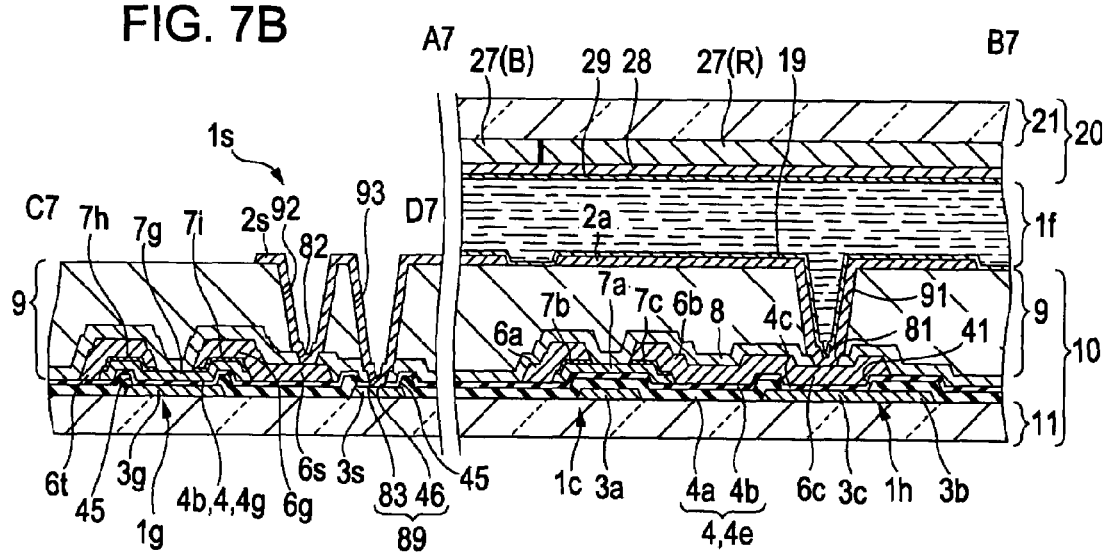
Figure 7C:
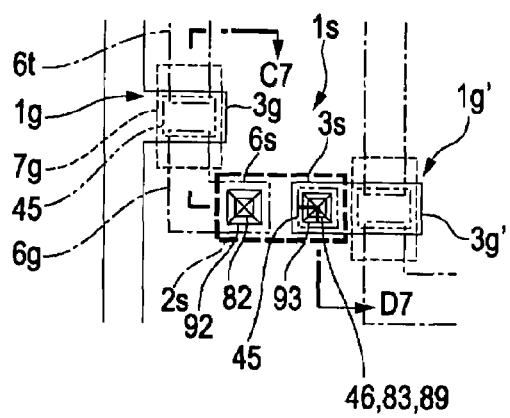

Although, in Embodiment 1, the removed region 45 in which the lower insulating film 4a is removed over the thickness direction is formed over the wide region of the driving circuit forming region of FIGS. 3b and 3c, the removed region 45 in which the lower insulating film 4a is removed over the thickness direction may be formed in the inner region spaced apart from the outer edge of a region, in which the signal line 3g and the active layer 7g overlap, by a predetermined distance, as shown in FIGS. 7b and 7c, similar to a region in which the storage capacitor 1h is formed as shown in FIGS. 7a and 7b. By this configuration, since the thick insulating film 4 can be interposed in the outer edge of the region in which the signal line 3g and the active layer 7g overlap, it is possible to ensure a sufficient gate withstanding voltage of the thin-film transistor 1g even when the gate insulating layer 4g is thinned. At this time, in the contact portion 1s, the remove region 45 in which the lower insulating film 4a is removed over the thickness direction is formed even in the region including the region in which the contact hole 89 is formed. The other configuration is identical to that of Embodiment 1 and thus the description thereof will be omitted. The present embodiment is not limited to Embodiment 1 and is applicable to the following embodiments.

Embodiment 2

Figure 8A:
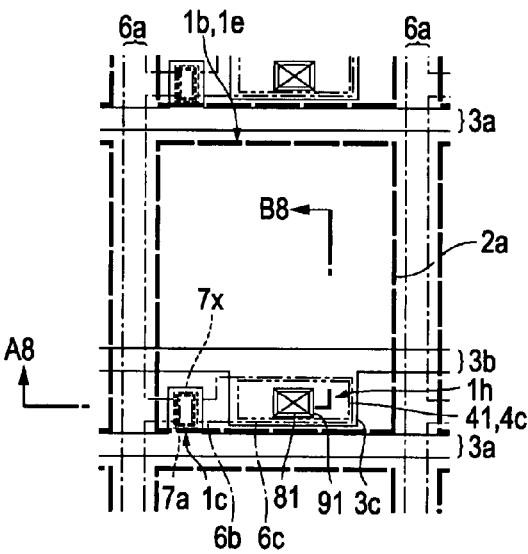
FIGS. 8a, 8b and 8c are respectively a plan view showing one pixel of a liquid crystal apparatus according to Embodiment 2 of the invention, a cross-sectional view taken along lines A8-B8 and C8-D8, and a plan view showing a thin-film transistor used in a driving circuit.
Figure 8B:
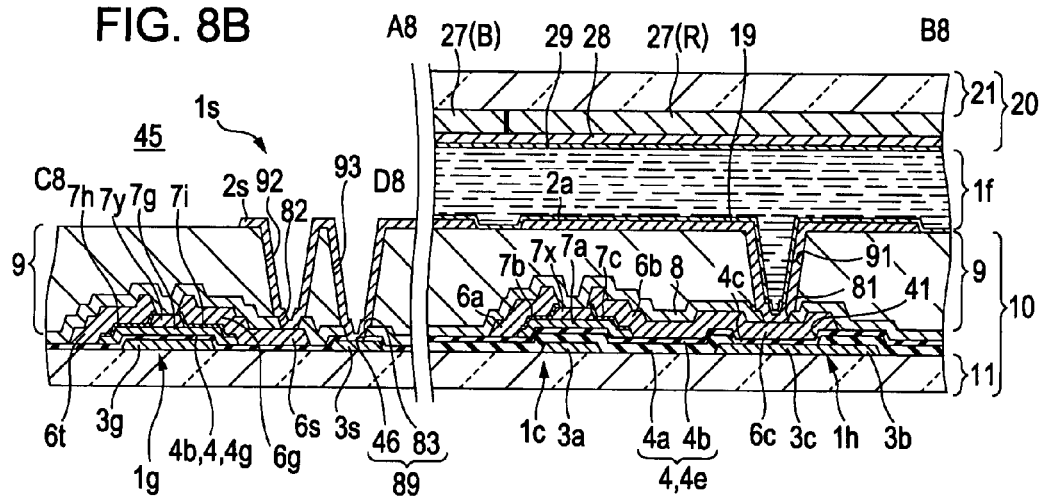
Figure 8C:
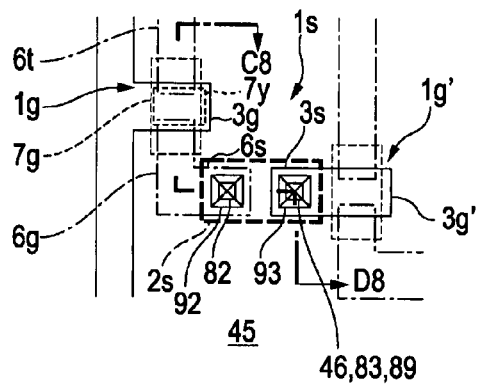

FIGS. 8a, 8b and 8c are respectively a plan view showing one pixel of a liquid crystal apparatus according to Embodiment 2 of the invention, a cross-sectional view taken along lines A8-B8 and C8-D8, and a plan view showing a thin-film transistor used in a driving circuit. FIGS. 9a to 9g are cross-sectional views showing processes until a source and drain electrode is formed, in a method of manufacturing a device substrate 10 used in the liquid crystal apparatus 1 according to the present embodiment. Even in the present embodiment and the following embodiments, a pixel electrode is indicated by a thick elongated dotted-line, a gate line and a thin film which are simultaneously formed are indicated by a thin solid line, a source line and a thin film which are simultaneously formed are indicated by a dashed-dotted line, a semiconductor film is indicated by a thin short dotted line, a removed region of the insulating film is indicated by a dashed two-dotted line and a contact hole is indicated by the thin solid line similar to the gate line. Since the basic configuration of the present embodiment is identical to that of Embodiment 1, like elements are denoted by like reference numerals and the description thereof will be omitted.

As shown in FIGS. 8a and 8b, even in the present embodiment, similar to Embodiment 1, a bottom-gate thin-film transistor 1c and a storage capacitor 1h are formed on a device substrate 10 in a pixel region 1e surrounded by a gate line 3a and a source line 6a. In the storage capacitor 1h, a protruding portion of a capacitive line 3b is a lower electrode 1c and an extending portion of a drain electrode 6b is an upper electrode 6c. Similar to Embodiment 1, an insulating film 4 has a two-layer structure including a lower insulating film 4a formed of a thick silicon nitride film and an upper insulating film 4b formed of a thin silicon nitride film and configures a gate insulating layer 4e of the thin-film transistor 1c.

Here, the lower insulating film 4a is removed over the thickness direction in a region, in which the lower electrode 3c and the upper electrode 6c of the storage capacitor 1h overlap in a plane, to form a removed region 41. Accordingly, a dielectric layer of the storage capacitor 1h is formed of the thin upper insulating film 4b of the insulating film 4. An insulating film having the same thickness as the insulating film 4 is formed on the lower electrode 3c along the edge of the lower electrode 3c and a dielectric layer 4c is surrounded by the thick insulating film.

Even in the present embodiment, similar to Embodiment 1, as shown in FIGS. 8b and 8c, a removed region 45 in which the lower insulating film 4a is removed over the thickness direction is formed in a driving circuit forming region over a wide region including a region which overlaps a protruding portion (gate electrode) of a signal line 3g of a thin-film transistor 1g. In the removed region 45, only the thin upper insulating film 4b is formed as the insulating film 4. Accordingly, the gate insulating film 4g of the thin-film transistor 1g includes the upper insulating film 4b. In a contact portion 1s, a region in which the contact hole 89 is formed is located at the removed region 45 in which the lower insulating film 4a is removed over the thickness direction, and the lower hole 46 penetrates through only the upper insulating film 4b.

In the present embodiment, an etch stop layer 7x is formed on the first active layer 7a of the thin-film transistor 1c in a region interposed between the end of a source line 6a (source electrode) and the end of a drain electrode 6b, and ohmic contact layers 7b and 7c are formed to cover the upper side of the etch stop layer 7x. An etch stop layer 7y is formed on the active layer 7g of the thin-film transistor 1g in a region interposed between the end of a signal line 6t (source electrode) and the end of a drain wiring 6g and ohmic contact layers 7h and 7i are formed to cover the upper side of the etch stop layer 7y. In the present embodiment, the etch stop layers 7× and 7y are formed of a silicon nitride film having a thickness of 150 nm. The other configuration is identical to that of Embodiment 1 and thus the description thereof will be omitted.

Figure 9A:
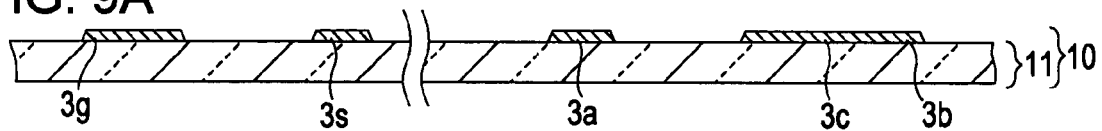
FIGS. 9a to 9g are cross-sectional views showing a method of manufacturing a device substrate used in the liquid crystal apparatus shown in FIG. 8.

In order to manufacture the device substrate 10 having the above-described configuration, in a process of forming a gate electrode shown in FIG. 9a, a metal film (a laminated film having an aluminum alloy film and a molybdenum film) is formed on the surface of an insulating substrate 11 and the metal film is patterned using photolithography such that a gate line 3a (gate electrode), a capacitive line 3b (lower electrode 3c), a signal line 3g (gate electrode) and a lower conductive layer 3s are simultaneously formed.

Figure 9B:
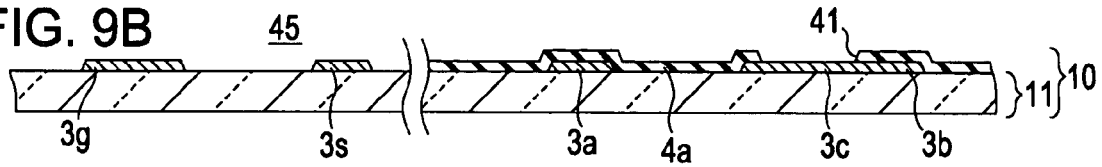

Next, similar to Embodiment 1, in a process of forming a lower gate insulating layer shown in FIG. 9b, a thick silicon nitride film (lower insulating film 4a) for configuring a lower layer of an insulating film 4 is formed by a plasma CVD method. In a thinning process, the lower insulating film 4a is etched to form removed regions 41 and 45. Next, in a process of forming an upper insulating film shown in FIG. 9c, a thin silicon nitride film (upper insulating film 4b) for configuring an upper layer of the insulating film 4 is formed. As a result, a gate insulating layer 4g and a dielectric layer 4c are formed by the upper insulating film 4b. In addition, the gate insulating layer 4e is formed by the lower insulating film 4a and the upper insulating film 4b.

Figure 9C:
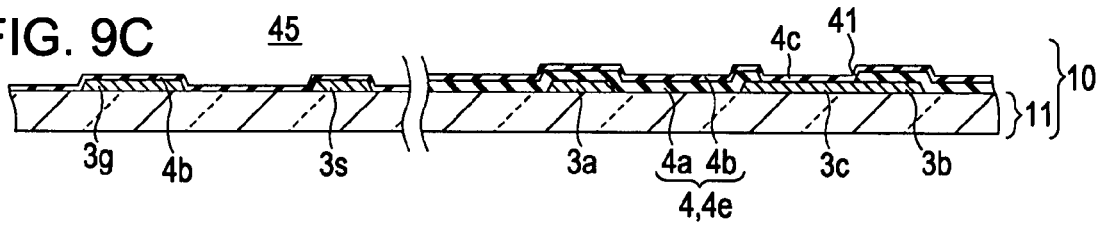
Figure 9D:
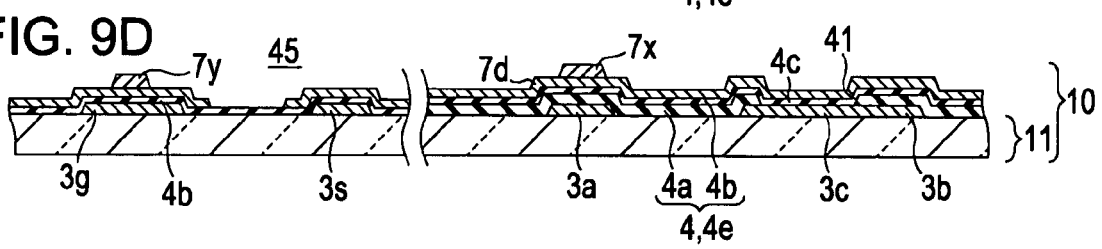

Next, in a process of forming a semiconductor film shown in FIG. 9d, an intrinsic amorphous silicon film 7d is formed by the plasma CVD method. At this time, while the device substrate 10 which is subjected to the process of forming the upper insulating film shown in FIG. 9c is maintained in a vacuum atmosphere, the process of forming the semiconductor film shown in FIG. 9d is performed such that the device substrate 10 does not contact air. Accordingly, the amorphous silicon film 7d (active layer) can be laminated in a state that the surface of the insulating film 4 (upper insulating film 4b) is clean. Next, a silicon nitride film having a thickness of 150 nm is formed on the amorphous silicon film 7d and is etched to form etch stop layers 7× and 7y. Even in this etching, reactive ion etching (dry etching) using fluorinated etching gas such as $SF_6$ is performed.

Figure 9E:
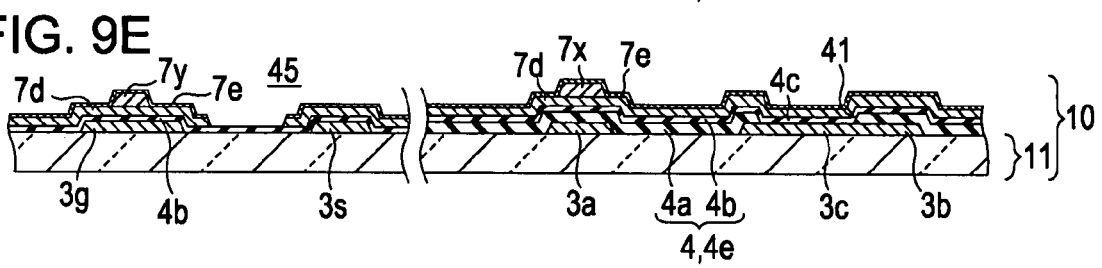
Figure 9F:
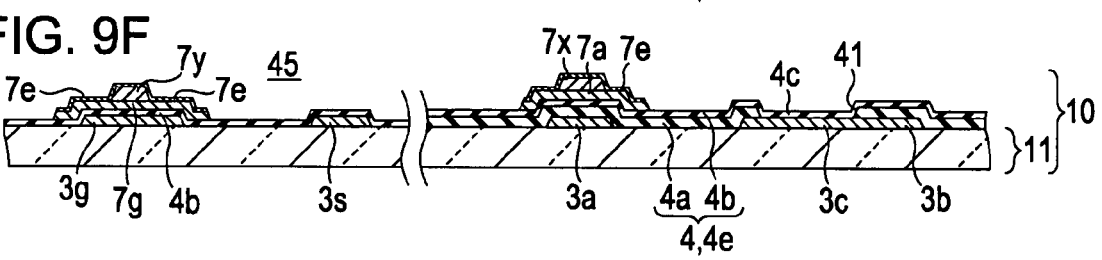

Next, as shown in FIG. 9e, an $N^+$-type silicon film 7e is formed on the etch stop layers 7x and 7y. Next, as shown in FIG. 9f, the amorphous silicon film 7d and the $N^+$-type silicon film 7e are dry-etched using photolithography to form island-shaped active layers 7a and 7g and the $N^+$-type silicon film 7e.

Figure 9G:
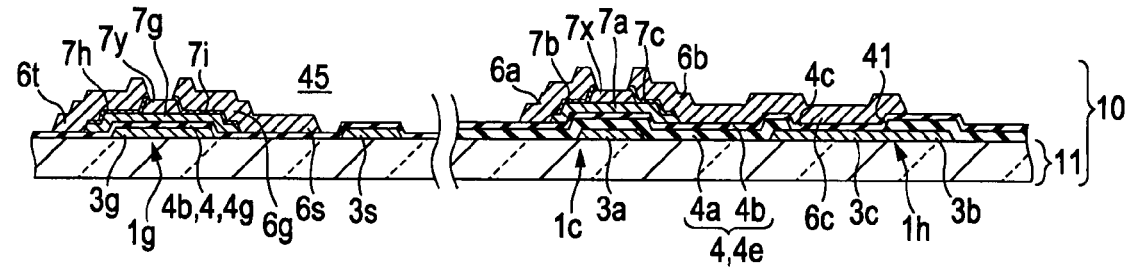

Next, in a process of forming a source and drain electrode shown in FIG. 9g, a metal film (a laminated film having a molybdenum film, an aluminum film and a molybdenum film) is formed and patterned using photolithography such that a source line 6a, a drain electrode 6b (upper electrode 6c), a signal line 6t and a drain wiring 6g (upper conductive layer 6s) are formed. Subsequently, the $N^+$-type silicon film 7e between the source line 6a and the drain electrode 6b is removed by the etching using the source line 6a and the drain electrode 6b as a mask and the $N^+$-type silicon film 7e between the signal line 6t and the drain wiring 6g is removed by the etching using the signal line 6t and the drain wiring 6g as a mask, thereby dividing the source and drain electrode. As a result, ohmic contact layers 7b, 7c, 7h and 7i are formed. At this time, the etch stop layers 7× and 7y having a function for protecting the active layers 7a and 7g. Accordingly, the bottom-gate pixel-switching thin-film transistors 1c and 1g are formed and the storage capacitor 1h is formed. The following processes are identical those of Embodiment 1 and thus the description thereof will be omitted.

In the present embodiment, since the basic configurations of the thin-film transistors 1c and 1g and the storage capacitor 1h are identical to those of Embodiment 1, a thin-film transistor 1c having a high gate withstanding voltage and a thin-film transistor 1g having excellent ON current characteristics can be formed and a storage capacitor 1h having a large capacitance value and a stable withstanding voltage can be formed. That is, the same effect as Embodiment 1 is obtained.

As shown in FIG. 9d, when the etch stop layer 7x is formed, the amorphous silicon film 7d has a function for protecting the upper insulating film 4b. Therefore, even when the etch stop layer 7x is formed, it is possible to prevent defect from being generated in the upper insulating film 4b used as the dielectric layer 4c.

Embodiment 3

Figure 10A:
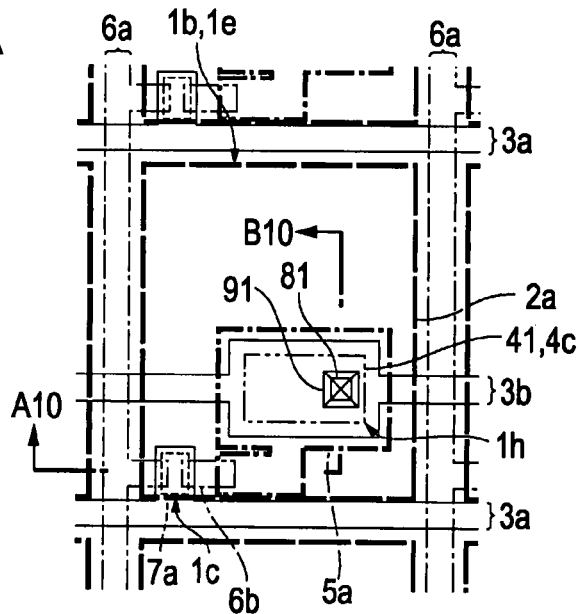
FIGS. 10a, 10b and 10c are respectively a plan view showing one pixel of a liquid crystal apparatus according to Embodiment 3 of the invention, a cross-sectional view taken along lines A10-B10 and C10-D10, and a plan view showing a thin-film transistor used in a driving circuit.
Figure 10B:
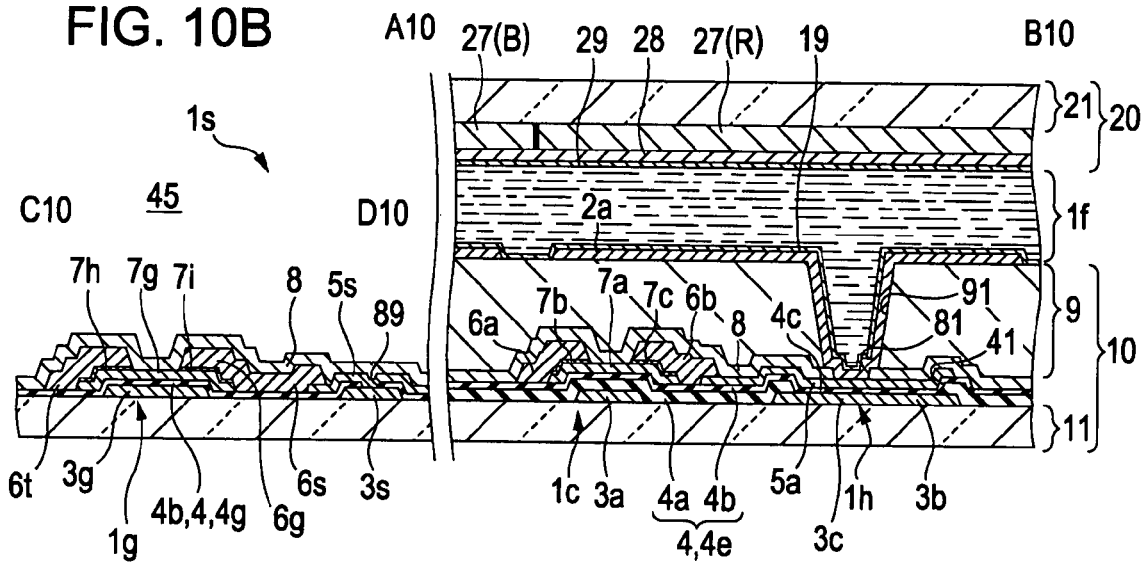
Figure 10C:
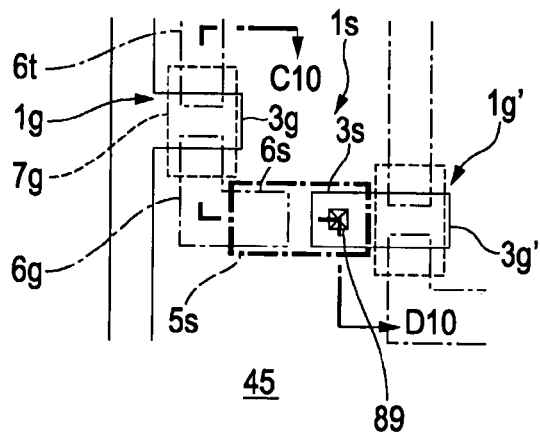

FIGS. 10a, 10b and 10c are respectively a plan view showing one pixel of a liquid crystal apparatus according to Embodiment 3 of the invention, a cross-sectional view taken along lines A10-B10 and C10-D10, and a plan view showing a thin-film transistor used in a driving circuit. FIGS. 11a to 11*h* are cross-sectional views showing processes until a source and drain electrode is formed, in a method of manufacturing a device substrate 10 used in the liquid crystal apparatus 1 according to the present embodiment.

As shown in FIGS. 10*a* and 10*b*, even in the present embodiment, similar to Embodiment 1, a bottom-gate thin-film transistor 1*c* and a storage capacitor 1*h* are formed on a device substrate 10 in a pixel region 1*e* surrounded by a gate line 3*a* and a source line 6*a*.

The present embodiment is similar to Embodiment 1 in that a protruding portion of a capacitive line 3*b* is a lower electrode 3*c* of a storage capacitor 1*h*. However, an upper electrode 5*a* of the storage capacitor 1*h* is formed of an ITO film formed between an insulating film 4 and a drain electrode 6*b* and the upper electrode 5*a* is electrically connected to the drain electrode 6*b* by a partial overlapping portion of the drain electrode 6*b*. In the present embodiment, the thickness of the ITO film for configuring the upper electrode 5*a* is 50 nm. A pixel electrode 2*a* formed on a planarization film 9 is electrically connected to the upper electrode 5*a* through contact holes 81 and 91.

Similar to Embodiment 1, the insulating film 4 has a two-layer structure including a lower insulating film 4*a* formed of a thick silicon nitride film and an upper insulating film 4*b* formed of a thin silicon nitride film and configures a gate insulating layer 4*e* of the thin-film transistor 1*c*.

The lower insulating film 4*a* is removed over the thickness direction in a region, in which the lower electrode 3*c* and the upper electrode 5*a* of the storage capacitor 1*h* overlap in a plane, to form a removed region 41. Accordingly, a dielectric layer of the storage capacitor 1*h* is formed of the thin lower insulating film 4*a* of the insulating film 4. An insulating film having the same thickness as the insulating film 4 is formed on the lower electrode 3*c* along the edge of the lower electrode 3*c* and a dielectric layer 4*c* is surrounded by the thick insulating film.

Even in the present embodiment, similar to Embodiment 1, as shown in FIGS. 10*b* and 10*c*, a removed region 45 in which the lower insulating film 4*a* is removed over the thickness direction is formed in a driving circuit forming region over a wide region including a region which overlaps a protruding portion (gate electrode) of a signal line 3*g* of a thin-film transistor 1*g*. In the removed region 45, only the thin upper insulating film 4*b* is formed as the insulating film 4. Accordingly, a gate insulating film 4*g* of the thin-film transistor 1*g* includes the upper insulating film 4*b*.

In a contact portion 1*s*, a region in which the contact hole 89 is formed is located at the removed region 45 in which the lower insulating film 4*a* is removed over the thickness direction. A planarization film 9 is not formed in the contact portion 1*s* and the electrical connection between an upper conductive layer 6*s* and a lower conductive layer 3*s* is realized by a conductive pattern 5*s* formed of an ITO film which is simultaneously formed with the upper electrode 5*a* of the storage capacitor 1*h*. Here, since the conductive pattern 5*s* is electrically connected to the upper conductive layer 6*s* by a partial overlapping portion with the upper conductive layer 6*s*, the contact hole is not used in the electrical connection between the conductive pattern 5*s* and the upper conductive layer 6*s*. The conductive pattern 5*s* is electrically connected to the lower conductive layer 3*s* through a contact hole 89, but the contact hole 89 is formed of a portion which penetrates through only the upper insulating film 4*b*. The other configuration is identical to that of Embodiment 1 and thus the description thereof will be omitted.

Figure 11A:
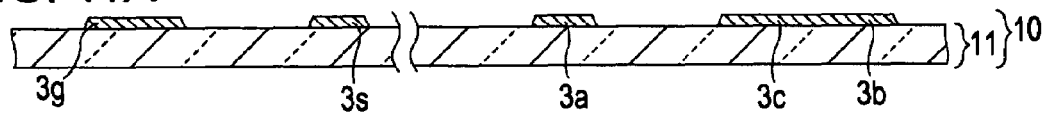
FIGS. 11a to 11h are cross-sectional views showing a method of manufacturing a device substrate used in the liquid crystal apparatus shown in FIG. 10.

In order to manufacture the device substrate 10 having the above-described configuration, in a process of forming a gate electrode shown in FIG. 11*a*, a metal film (a laminated film having an aluminum alloy film and a molybdenum film) is formed on the surface of an insulating substrate 11 and the metal film is patterned using photolithography such that a gate line 3*a* (gate electrode), a capacitive line 3*b* (lower electrode 3*c*), a signal line 3*g* (gate electrode) and a lower conductive layer 3*s* are simultaneously formed.

Figure 11B:
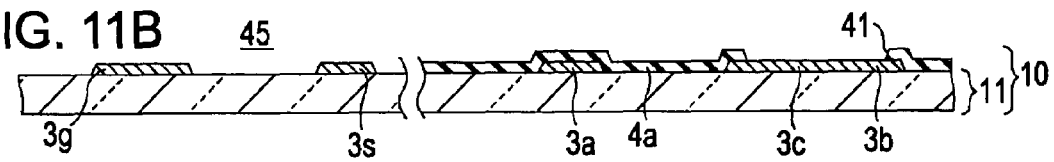

Next, similar to Embodiment 1, in a process of forming a lower gate insulating layer shown in FIG. 11*b*, a thick silicon nitride film (lower insulating film 4*a*) for configuring a lower layer of an insulating film 4 is formed by a plasma CVD method. In a thinning process, the lower insulating film 4*a* is etched to form removed regions 41 and 45. Next, in a process of forming an upper insulating film shown in FIG. 11*c*, a thin silicon nitride film (upper insulating film 4*b*) for configuring an upper layer of the insulating film 4 is formed. As a result, a gate insulating layer 4*g* and a dielectric layer 4*c* are formed by the upper insulating film 4*b*. In addition, the gate insulating layer 4*e* is formed by the lower insulating film 4*a* and the upper insulating film 4*b*.

Figure 11C:
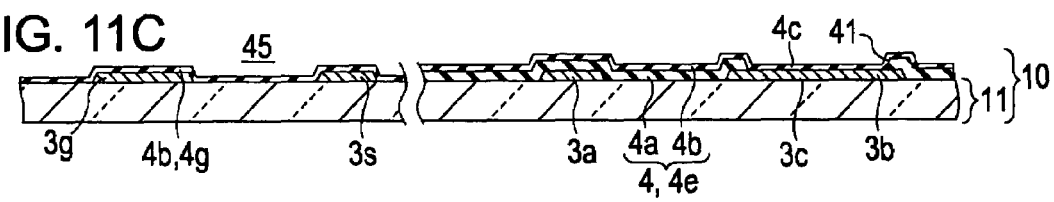
Figure 11D:
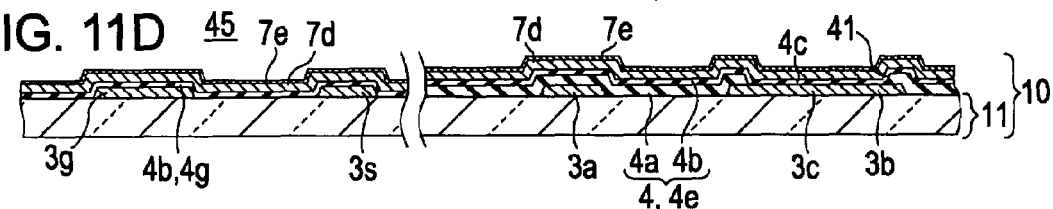

Next, in a process of forming a semiconductor film shown in FIG. 11*d*, an intrinsic amorphous silicon film 7*d* and an $N^+$-type silicon film 7*e* are sequentially formed by the plasma CVD method. At this time, while the device substrate 10 which is subjected to the process of forming the upper insulating film shown in FIG. 11*c* is maintained in a vacuum atmosphere, the process of forming the semiconductor film shown in FIG. 11*d* is performed such that the device substrate 10 does not contact air. Accordingly, the amorphous silicon film 7*d* (active layer) can be laminated in a state that the surface of the insulating film 4 (upper insulating film 4*b*) is clean.

Figure 11E:
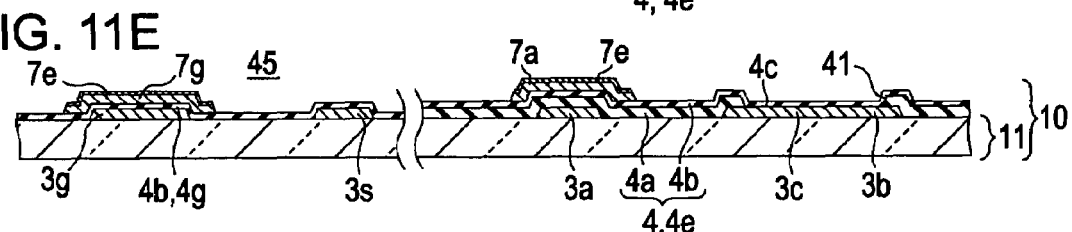

Next, as shown in FIG. 11*e*, the amorphous silicon film 7*d* and the $N^+$-type silicon film 7*e* are dry-etched using photolithography to form island-shaped active layers 7*a* and 7*g* and the island-shaped $N^+$-type silicon film 7*e*.

Figure 11F:
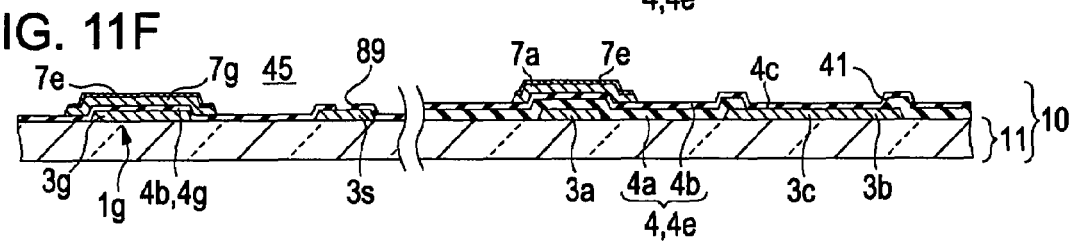

Next, in a process of forming a contact hole shown in FIG. 11*f*, the upper insulating film 4*a* is dry-etched using photolithography to form a contact hole 89.

Figure 11G:
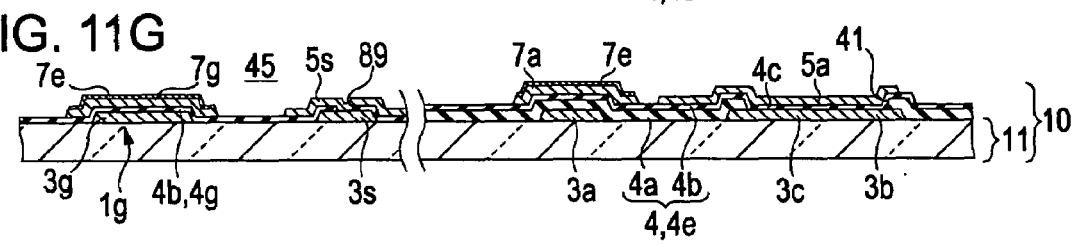

Next, in a process of forming an upper electrode shown in FIG. 11*g*, an ITO film having a thickness of 50 nm is formed by a sputter method and is wet-etched using photolithography to form an upper electrode 5*a* and a conductive pattern 5*s*. Accordingly, a storage capacitor 1*h* is formed.

Figure 11H:
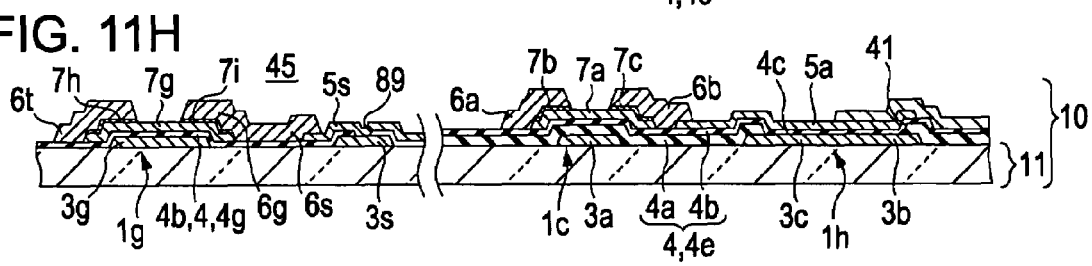

Next, as shown in FIG. 11*h*, a metal film (a laminated film having a molybdenum film, an aluminum film and a molybdenum film) is formed and patterned using photolithography such that a source line 6*a*, a drain electrode 6*b* (upper electrode 6*c*), a signal line 6*t* and a drain wiring 6*g* (upper conductive layer 6*s*) are formed. Subsequently, the $N^+$-type silicon film 7*e* between the source line 6*a* and the drain electrode 6*b* is removed by the etching using the source line 6*a* and the drain electrode 6*b* as a mask and the $N^+$-type silicon film 7*e* between the signal line 6*t* and the drain wiring 6*g* is removed by the etching using the signal line 6*t* and the drain wiring 6*g* as a mask, thereby dividing the source and drain electrode. As a result, the bottom-gate pixel-switching thin-film transistors 1*c* and 1*g* are formed and the upper conductive layer 6*s* and the lower conductive layer 3*s* are electrically connected by the conductive pattern 5*s*. The following processes are identical those of Embodiment 1 and thus the description thereof will be omitted.

In the present embodiment, since the basic configurations of the thin-film transistors 1*c* and 1*g* and the storage capacitor 1*h* are identical to those of Embodiment 1, a thin-film transistor 1*c* having a high gate withstanding voltage and a thin-film transistor 1*g* having excellent ON current characteristics can be formed and a storage capacitor 1h having a large capacitance value and a stable withstanding voltage can be formed. That is, the same effect as Embodiment 1 is obtained.

Since the ITO film (transparent electrode) is used as the upper electrode 5a, it is possible to increase a pixel aperture ratio compared with a case where an extending portion of the drain electrode 6b is used as the upper electrode.

Embodiment 4

Figure 12A:
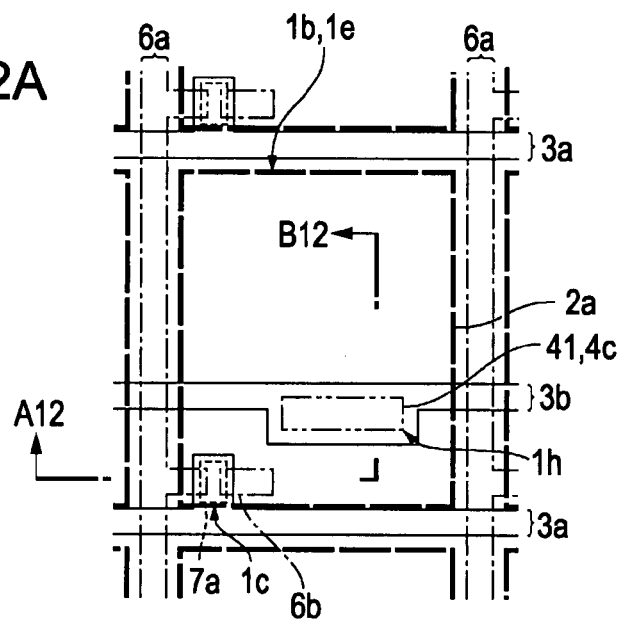
FIGS. 12a, 12b and 12c are respectively a plan view showing one pixel of a liquid crystal apparatus according to Embodiment 4 of the invention, a cross-sectional view taken along lines A12-B12 and C12-D12, and a plan view showing a thin-film transistor used in a driving circuit.
Figure 12B:
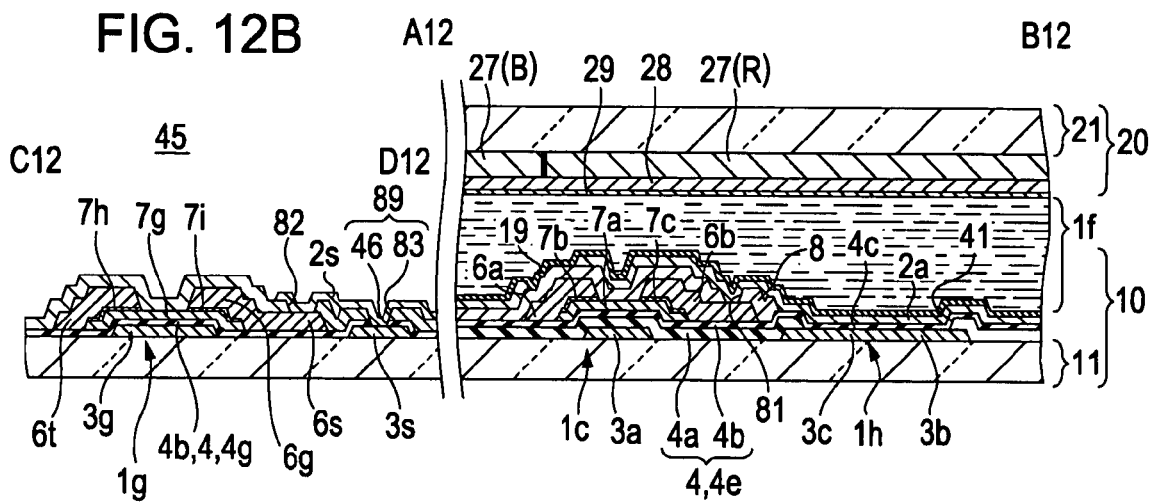
Figure 12C:
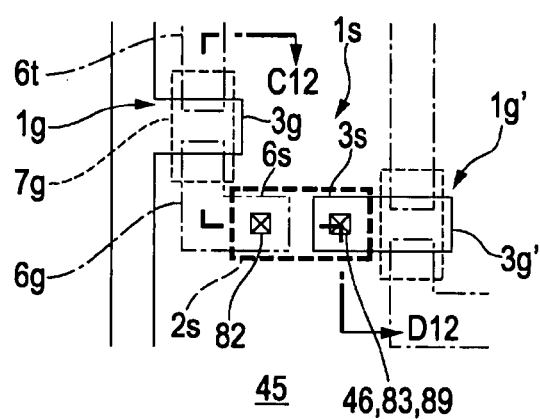

FIGS. 12a, 12b and 12c are respectively a plan view showing one pixel of a liquid crystal apparatus according to Embodiment 4 of the invention, a cross-sectional view taken along lines A12-B12 and C12-D12, and a plan view showing a thin-film transistor used in a driving circuit. FIGS. 13a to 13g are cross-sectional views showing processes until a contact hole is formed in a passivation film, in a method of manufacturing a device substrate 10 used in the liquid crystal apparatus 1 according to the present embodiment.

As shown in FIGS. 12a and 12b, even in the present embodiment, similar to Embodiment 1, a bottom-gate thin-film transistor 1c and a storage capacitor 1h are formed on a device substrate 10 in a pixel region 1e surrounded by a gate line 3a and a source line 6a. However, unlike Embodiments 1 to 3, in the present embodiment, a planarization film is not formed and a pixel electrode 2a is formed on the passivation film 8 and is electrically connected to a drain electrode 6b through a contact hole 81 for connecting a pixel electrode formed on the passivation film 8.

The present embodiment is similar to Embodiment 1 in that a protruding portion of a capacitive line 3b is a lower electrode 3c of the storage capacitor 1h. However, an upper electrode of the storage capacitor 1h is formed of a portion, which overlaps the lower electrode 3c in a plane, of the pixel electrode 2a.

Similar to Embodiment 1, an insulating film 4 has a two-layer structure including a lower insulating film 4a formed of a thick silicon nitride film and an upper insulating film 4b formed of a thin silicon nitride film and configures a gate insulating layer 4e of the thin-film transistor 1c.

The lower insulating film 4a is removed over the thickness direction in a region, in which the lower electrode 3c of the storage capacitor 1h and the pixel electrode 2a overlap in a plane, to form a removed region 41. Accordingly, a dielectric layer of the storage capacitor 1h is formed of the thin lower insulating film 4a of the insulating film 4. An insulating film having the same thickness as the insulating film 4 is formed on the lower electrode 3c along the edge of the lower electrode 3c and a dielectric layer 4c is surrounded by the thick insulating film.

Even in the present embodiment, similar to Embodiment 1, as shown in FIGS. 12b and 12c, a removed region 45 in which the lower insulating film 4a is removed over the thickness direction is formed in a driving circuit forming region over a wide region including a region which overlaps a protruding portion (gate electrode) of a signal line 3g of a thin-film transistor 1g. In the removed region 45, only the thin upper insulating film 4b is formed as the insulating film 4. Accordingly, a gate insulating film 4g of the thin-film transistor 1g includes only the upper insulating film 4b.

In a contact portion 1s, a region in which the contact hole 89 is formed is located at the removed region 45 in which the lower insulating film 4a is removed over the thickness direction. In the contact portion is, the electrical connection between an upper conductive layer 6s and a lower conductive layer 3s is realized by a conductive pattern 2s formed of an ITO film which is simultaneously formed with the pixel electrode 2a. The other configuration is identical to that of Embodiment 1 and thus the description thereof will be omitted.

Figure 13A:
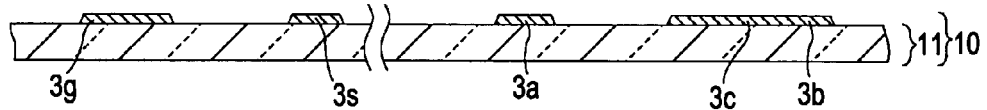
FIGS. 13a to 13g are cross-sectional views showing a method of manufacturing a device substrate used in the liquid crystal apparatus shown in FIG. 12.

In order to manufacture the device substrate 10 having the above-described configuration, in a process of forming a gate electrode shown in FIG. 13a, a metal film (a laminated film having an aluminum alloy film and a molybdenum film) is formed on the surface of an insulating substrate 11 and the metal film is patterned using photolithography such that a gate line 3a (gate electrode), a capacitive line 3b (lower electrode 3c), a signal line 3g (gate electrode) and a lower conductive layer 3s are simultaneously formed.

Figure 13B:
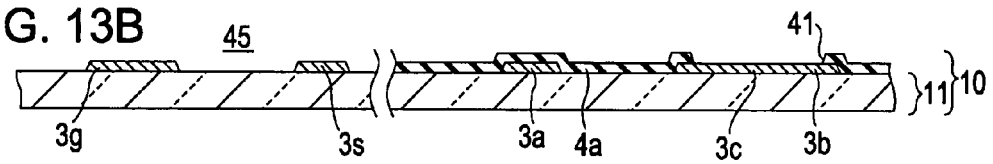

Next, similar to Embodiment in a process of forming a lower gate insulating layer shown in FIG. 13b, a thick silicon nitride film (lower insulating film 4a) for configuring a lower layer of an insulating film 4 is formed by a plasma CVD method. In a thinning process, the lower insulating film 4a is etched to form removed regions 41 and 45 which overlaps the lower electrode 3c. Next, in a process of forming an upper insulating film shown in FIG. 13c, a thin silicon nitride film (upper insulating film 4b) for configuring an upper layer of the insulating film 4 is formed. As a result, a gate insulating layer 4g and a dielectric layer 4c are formed by the upper insulating film 4b. In addition, the gate insulating layer 4e is formed by the lower insulating film 4a and the upper insulating film 4b.

Figure 13C:
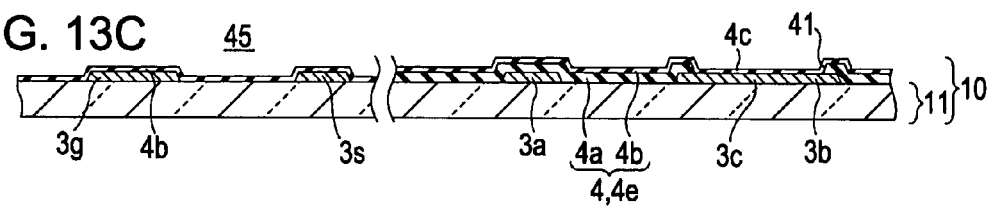
Figure 13D:
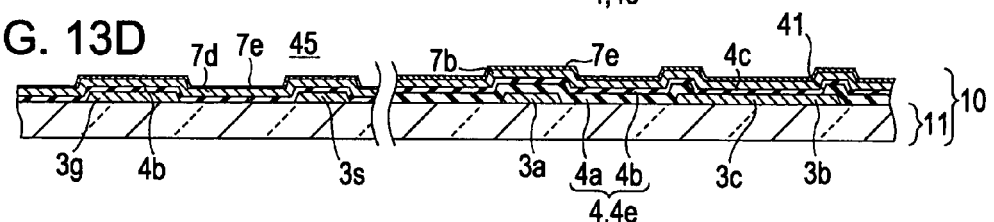

Next, in a process of forming a semiconductor film shown in FIG. 13d, an intrinsic amorphous silicon film 7d and an N+-type silicon film 7e are sequentially formed by the plasma CVD method. At this time, while the device substrate 10 which is subjected to the process of forming the upper insulating film shown in FIG. 13c is maintained in a vacuum atmosphere, the process of forming the semiconductor film shown in FIG. 13d is performed such that the device substrate 10 does not contact air. Accordingly, the amorphous silicon film 7d (active layer) can be laminated in a state that the surface of the insulating film 4 (upper insulating film 4b) is clean.

Figure 13E:
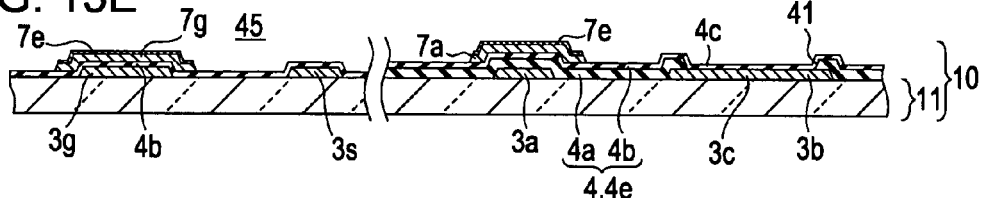

Next, as shown in FIG. 13e, the amorphous silicon film 7d and the N+-type silicon film 7e are dry-etched using photolithography to form island-shaped active layers 7a and 7g and the island-shaped N+-type silicon film 7e.

Figure 13F:
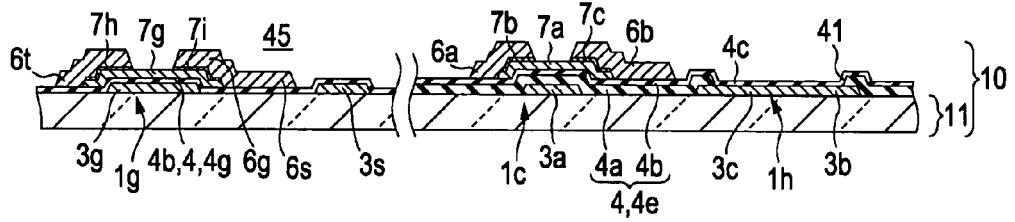

Next, as shown in FIG. 13f, a metal film (a laminated film having a molybdenum film, an aluminum film and a molybdenum film) is formed and patterned using photolithography such that a source line 6a, a drain electrode 6b (upper electrode 6c), a signal line 6t and a drain wiring 6g (upper conductive layer 6s) are formed. Subsequently, the N+-type silicon film 7e between the source line 6a and the drain electrode 6b is removed by the etching using the source line 6a and the drain electrode 6b as a mask and the N+-type silicon film 7e between the signal line 6t and the drain wiring 6g is removed by the etching using the signal line 6t and the drain wiring 6g as a mask, thereby dividing the source and drain electrode. As a result, the bottom-gate pixel-switching thin-film transistors 1c and 1g are formed.

Figure 13G:
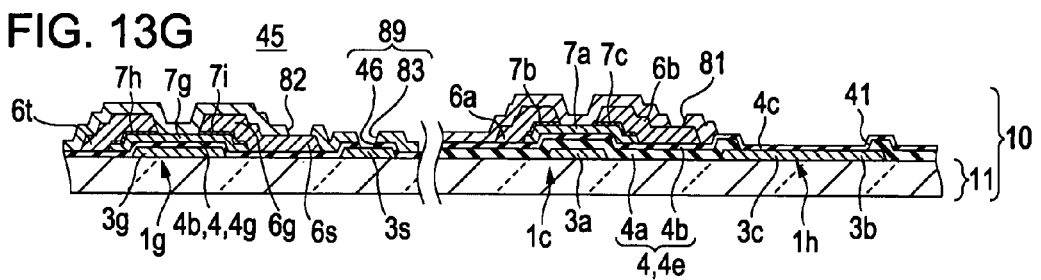

Next, as shown in FIG. 13g, in a process of forming an interlayer insulating film, a passivation film 8 formed of a silicon nitride film having a thickness of 250 nm is formed by the plasma CVD method. Then, in a process of forming a contact hole, the passivation film 8 is etched using photolithography to form contact holes 81, 82 and 89. Even in this etching, reactive ion etching (dry etching) using fluorinated etching gas such as $SF_6$ is performed. The following processes are identical those of Embodiment 1 and thus the description thereof will be omitted.

In the present embodiment, since the basic configurations of the thin-film transistors 1c and 1g and the storage capacitor 1h are identical to those of Embodiment 1, a thin-film transistor 1c having a high gate withstanding voltage and a thin-film transistor 1g having excellent ON current characteristics can be formed and a storage capacitor 1h having a large capacitance value and a stable withstanding voltage can be formed. That is, the same effect as Embodiment 1 is obtained.

Embodiment 5

Figure 14A:
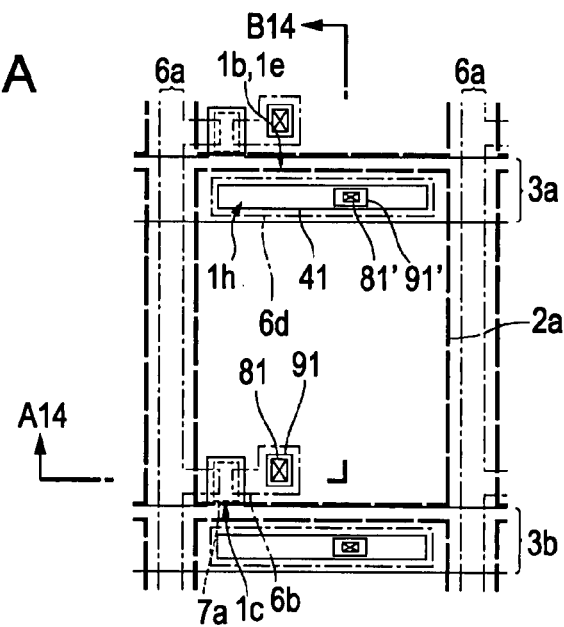
FIGS. 14a, 14b and 14c are respectively a plan view showing one pixel of a liquid crystal apparatus according to Embodiment 5 of the invention, a cross-sectional view taken along lines A14-B14 and C14-D14, and a plan view showing a thin-film transistor used in a driving circuit.
Figure 14B:
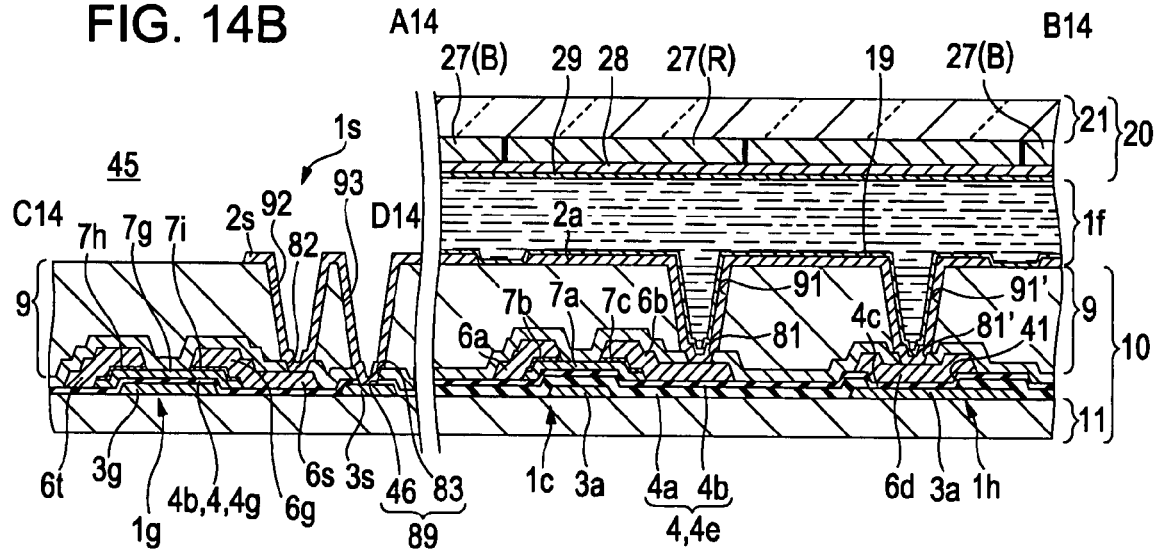
Figure 14C:
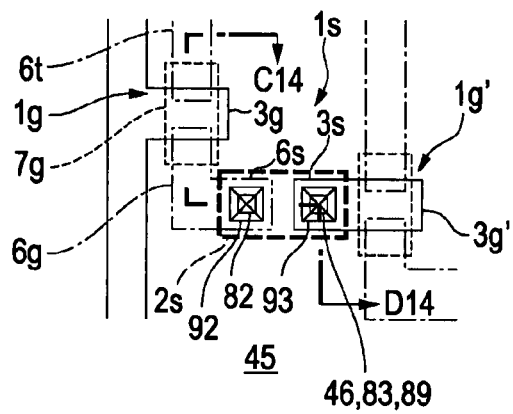

FIGS. 14a, 14b and 14c are respectively a plan view showing one pixel of a liquid crystal apparatus according to Embodiment 5 of the invention, a cross-sectional view taken along lines A14-B14 and C14-D14, and a plan view showing a thin-film transistor used in a driving circuit.

As shown in FIGS. 14a and 14b, even in the present embodiment, similar to Embodiment 1, a bottom-gate thin-film transistor 1c and a storage capacitor 1h are formed on a device substrate 10 in a pixel region 1e surrounded by a gate line 3a and a source line 6a. However, unlike Embodiments 1 to 4, in the present embodiment, a capacitive line is not formed and a lower electrode 3c of the storage capacitor 1h is formed of a portion of a previous-stage gate line 3a in a scanning direction (a direction crossing the extended direction of the gate line 3a/the extended direction of a source line 6a).

In the storage capacitor 1h, an upper electrode 6d is formed to overlap the lower electrode 3c. In the present embodiment, a metal layer which is simultaneously formed with the source line 6a or a drain electrode 6b is used as the upper electrode 6d. The upper electrode 6d is separated from the drain electrode 6b. Accordingly, a pixel electrode 2a formed on a planarization film 9 is electrically connected to the upper electrode 6d through a contact hole 81' of a passivation film 8 and a contact hole 91' of the planarization film 9 and is electrically connected to the drain electrode 6b through a contact hole 81 of the passivation film 8 and a contact hole 91 of the planarization film 9.

Similar to Embodiment 1, an insulating film 4 has a two-layer structure including a lower insulating film 4a formed of a thick silicon nitride film and an upper insulating film 4b formed of a thin silicon nitride film and configures a gate insulating layer 4e of the thin-film transistor 1c. The lower insulating film 4a is removed over the thickness direction in a region, in which the lower electrode 3c and the upper electrode 6d of the storage capacitor 1h overlap in a plane, to form a removed region 41. Accordingly, a dielectric layer of the storage capacitor 1h is formed of the thin lower insulating film 4a of the insulating film 4. An insulating film having the same thickness as the insulating film 4 is formed on the lower electrode 3c along the edge of the lower electrode 3c and a dielectric layer 4c is surrounded by the thick insulating film.

Even in the present embodiment, similar to Embodiment 1, as shown in FIGS. 14b and 14c, a removed region 45 in which the lower insulating film 4a is removed over the thickness direction is formed in a driving circuit forming region over a wide region including a region which overlaps a protruding portion (gate electrode) of a signal line 3g of a thin-film transistor 1g. In the removed region 45, only the thin upper insulating film 4b is formed as the insulating film 4. Accordingly, a gate insulating film 4g of the thin-film transistor 1g includes only the upper insulating film 4b. In a contact portion is, a region in which the contact hole 89 is formed is located at the removed region 45 in which the lower insulating film 4a is removed over the thickness direction. In the contact portion is, the electrical connection between an upper conductive layer 6s and a lower conductive layer 3s is realized by a conductive pattern 2s formed of an ITO film which is simultaneously formed with the pixel electrode 2a. The other configuration is identical to that of Embodiment 1 and thus the description thereof will be omitted.

The device substrate 10 having the above-described configuration can be manufactured by the same method as Embodiment 1. That is, in the process of forming a gate electrode shown in FIG. 5a, the capacitive line is not formed and the gate line 3a is formed with a planar shape shown in FIG. 14a. In the process of forming the source and drain electrode shown in FIG. 5g, the upper electrode 6d is formed when the source line 6a and the drain electrode 6b are formed. In the process of forming the planarization film shown in FIG. 6b, the planarization film including the contact holes 91 and 92 are formed and, in the process of forming the contact hole shown in FIG. 6c, the contact holes 81 and 81' are formed at positions which overlap the contact holes 91 and 91', when the passivation film 8 is etched using photolithography. In the contact portion is, the contact holes 82 and 89 are formed at positions which overlap the contact holes 92 and 93.

Embodiment 6

Figure 15A:
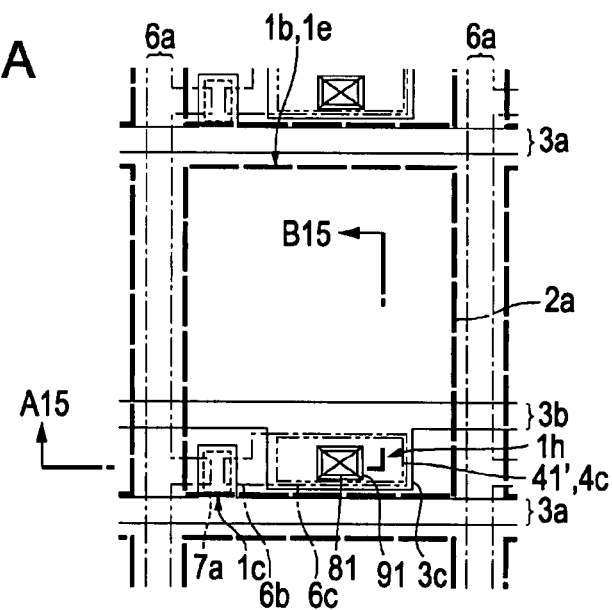
FIGS. 15a, 15b and 15c are respectively a plan view showing one pixel of a liquid crystal apparatus according to Embodiment 6 of the invention, a cross-sectional view taken along line A15-B15, and a plan view showing a thin-film transistor used in a driving circuit.
Figure 15B:
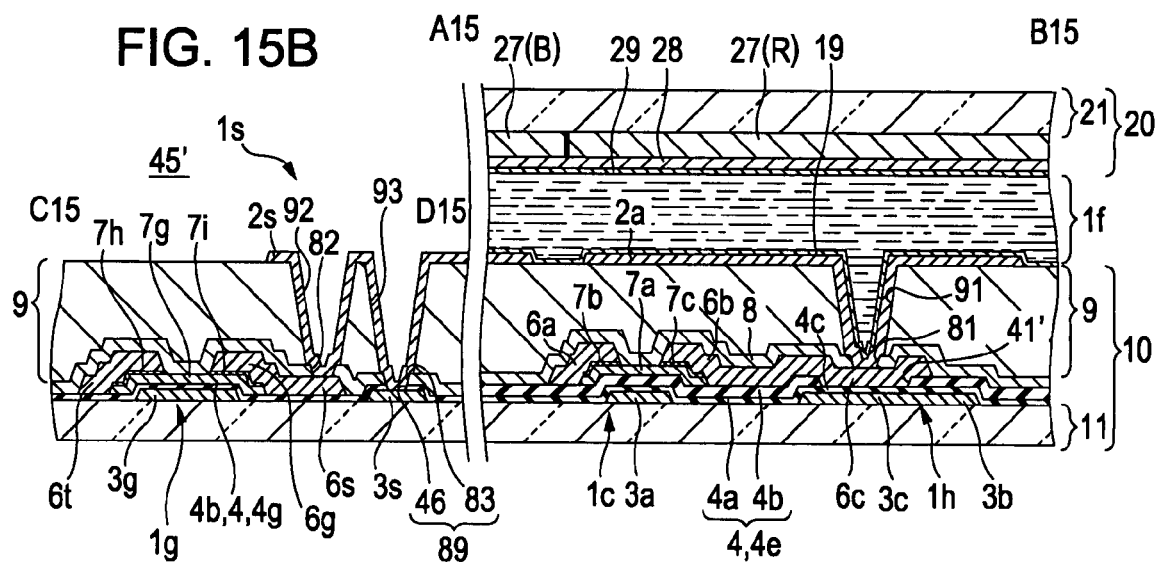
Figure 15C:
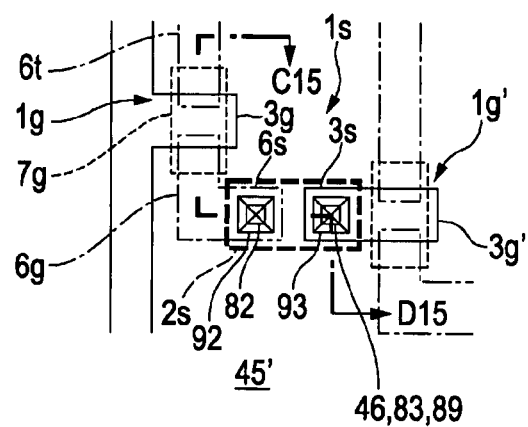
Figure 16A:
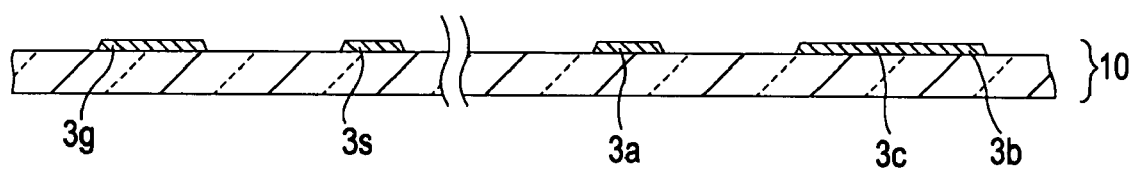
FIGS. 16a to 16c are cross-sectional views showing a method of manufacturing a device substrate used in the liquid crystal apparatus shown in FIG. 15.
Figure 16B:
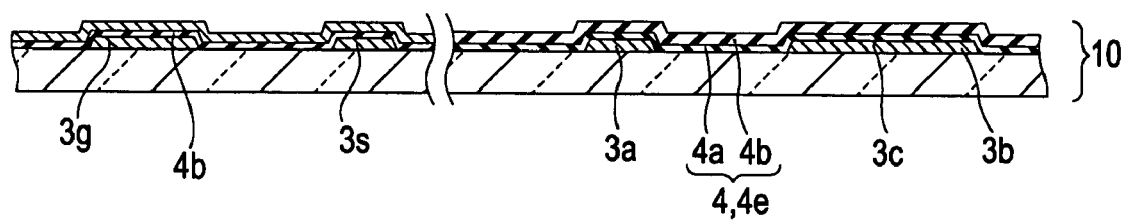
Figure 16C:
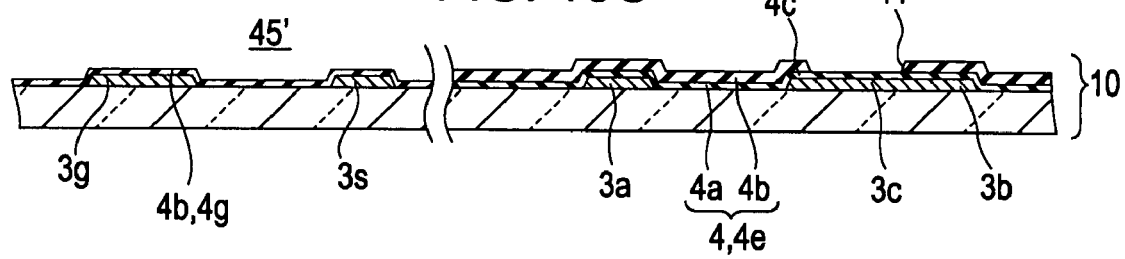

FIGS. 15a, 15b and 15c are respectively a plan view showing one pixel of a liquid crystal apparatus according to Embodiment 6 of the invention, a cross-sectional view taken along line A15-B15, and a plan view showing a thin-film transistor used in a driving circuit. FIGS. 16a to 16c are cross-sectional views showing processes until a gate insulating layer is formed, in a method of manufacturing a device substrate 10 used in the liquid crystal apparatus 1 according to the present embodiment.

While the lower insulating film 4a is removed to form the removed regions 41 and 45 in Embodiments 1 to 5, as shown in FIGS. 15a, 15b and 15c, an upper insulating film 4b is removed to form removed regions 41' and 45' in the present embodiment. The other configuration is identical to that of Embodiment 1 and thus the detailed description thereof will be omitted.

In order to manufacture the device substrate 10 having the above-described configuration, in a process of forming a gate electrode shown in FIG. 15a, a metal film (a laminated film having an aluminum alloy film and a molybdenum film) is formed on the surface of an insulating substrate 11 and the metal film is patterned using photolithography such that a gate line 3a (gate electrode), a capacitive line 3b (lower electrode 3c), a signal line 3g (gate electrode) and a lower conductive layer 3s are simultaneously formed.

Next, in a process of forming a gate insulating layer shown in FIG. 15b, a thin lower insulating film 4a for configuring a lower layer of an insulating film 4 and a thick upper insulating film 4b for configuring an upper layer of the insulating film 4 are formed.

Next, in a thinning process, the upper insulating film 4b in a region which overlaps a lower electrode 3c and a driving circuit forming region including a thin-film transistor 1g or a contact portion 1s is etched to form the removed regions 41' and 45'. As a result, a gate insulating layer 4g and a dielectric layer 4c are formed by the lower insulating film 4a and a gate insulating layer 4e is formed by the lower insulating film 4a and the upper insulating film 4b. The following processes are identical those of Embodiment 1 and thus the description thereof will be omitted.

Even in the device substrate 10 having the above-described configuration, a thin-film transistor 1c having a high gate withstanding voltage and a thin-film transistor 1g having excellent ON current characteristics can be formed and a storage capacitor 1h having a large capacitance value and a stable withstanding voltage can be formed. In addition, since the thickness of the insulating film 4 in which the contact hole 89 is formed is small, a dry etching time is short. Accordingly, it is possible to reduce a time that the gate insulating layer is exposed to static electricity or plasma.

Embodiment 7

Figure 17A:
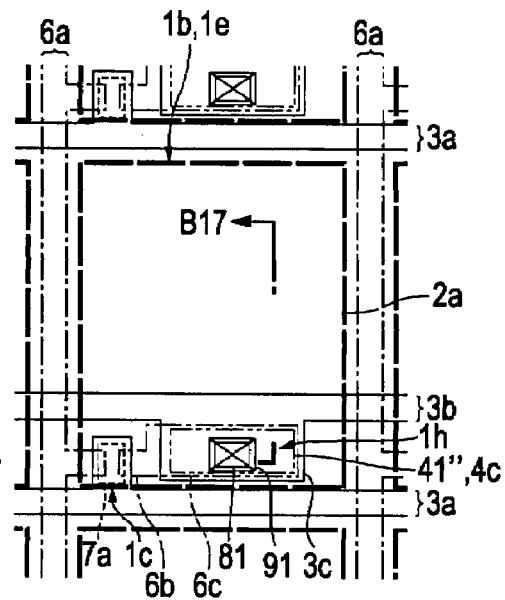
FIGS. 17a, 17b and 17c are respectively a plan view showing one pixel of a liquid crystal apparatus according to Embodiment 7 of the invention, a cross-sectional view taken along lines A17-B17, and a plan view showing a thin-film transistor used in a driving circuit.
Figure 17B:
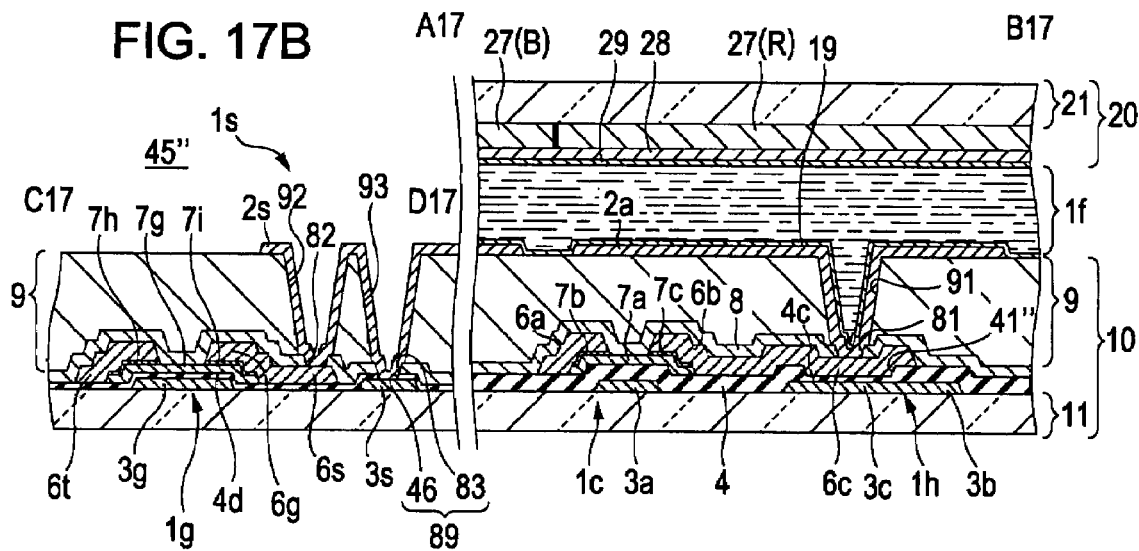
Figure 17C:
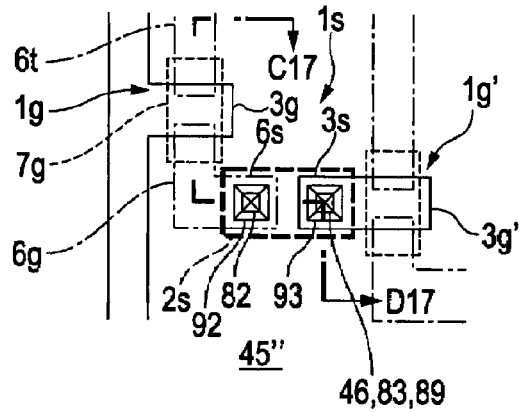

FIGS. 17a, 17b and 17c are respectively a plan view showing one pixel of a liquid crystal apparatus according to Embodiment 7 of the invention, a cross-sectional view taken along lines A17-B17 and C17-D17, and a plan view showing a thin-film transistor used in a driving circuit.

While the two-layer structure having the lower insulating film 4a and the upper insulating film 4b is employed as the insulating film 4 and the removed region is formed in the lower insulating film 4a in Embodiments 1 to 6, as shown in FIGS. 17a, 17b and 17c, a single-layer insulating film is employed as the insulating film 4 and removed regions 41" and 45" are formed by removing the insulting film 4 up to a middle portion by etching in the present embodiment. The other configuration is identical to that of Embodiment 1 and thus the detailed description thereof will be omitted. The device substrate 10 having the above-described configuration can be manufactured by the same method as Embodiment 6 and thus the description thereof will be omitted. Even in the device substrate 10 having the above-described configuration, a thin-film transistor 1c having a high gate withstanding voltage and a thin-film transistor 1g having excellent ON current characteristics can be formed and a storage capacitor 1h having a large capacitance value and a stable withstanding voltage can be formed. In addition, since the thickness of the insulating film 4 in which the contact hole 89 is formed is small, a dry etching time is short. Accordingly, it is possible to reduce a time that the gate insulating layer is exposed to static electricity or plasma.

Other Embodiments

Although the lower insulating film 4a and the upper insulating film 4b are formed of the same insulating film in Embodiments 1 to 6, the lower insulating film 4a and the upper insulating film 4b may be formed of different insulating films. In this case, when the insulating film 4 is formed of a silicon oxide film and a silicon nitride film, it is preferable that the upper insulating film 4b used as the dielectric layer 4c is formed of a silicon nitride film having high permittivity. Although each of the lower insulating film 4a and the upper insulating film 4b is formed of a single insulating in the above-described embodiments, each of the lower insulating film 4a and the upper insulating film 4b may be formed of a plurality of insulating films. Although the insulating film 4 is formed of two layers, that is, the dielectric layer 3c and the gate insulating layer 4g in Embodiments 1 to 7, the insulating film 4 may be formed of at least three layers and the dielectric layer 3c and the gate insulating layer 4g may be formed of different insulating films.

Although the thin-film transistor 1g is used in the driving circuit in Embodiments 1 to 7, since large ON current may be requested even in a test circuit formed in the device substrate 10, the thin-film transistor 1g may be used in the test circuit. The transistor for configuring the driving circuit and the test circuit may be formed of a combination of a first and second transistor.

Although the removed region 41 is formed in the inner region of the outer edge of the lower electrode 3c by removing the lower insulating film 4a in a case where a partially thin portion of the insulating film 4 is used as the dielectric layer 4c of the storage capacitor 1h, the lower insulating film 4a may be removed over a region wider than the lower electrode 3c or the upper electrode when no problem is caused due to the reduction of the withstanding voltage which is apt to be generated in the edge of the upper electrode or the edge of the lower electrode 3c or other countermeasure is applied.

Although a multi-layer film including the aluminum alloy film and the molybdenum film is used in the gate line 3a and a multi-layer film including the aluminum film and the molybdenum film is used in the source line 6a, other metal films may be used in the line and a conductive film such as silicide may be used. Although the intrinsic amorphous silicon film is used as the active layer 7a in the above-described embodiments, other silicon films, an organic semiconductor film or a transparent semiconductor film such as zinc oxide may be used.

Although the bottom-gate thin-film transistor is described in the above-described embodiments, a top-gate thin-film transistor may be used in the configuration of the thin-film transistor in the pixel region and the thin-film transistor a region other than the pixel region.

Although a transmissive liquid crystal apparatus is used in the above-described embodiments, the invention is applicable to a semi-transmissive reflective liquid crystal apparatus or a total reflective liquid crystal apparatus. Although an active matrix liquid crystal apparatus of a TN mode, an ECB mode or a VAN mode is described in the above-described embodiments, the invention is applicable to a liquid crystal apparatus (electro-optical apparatus) of an in-plane switching (IPS) mode.

The invention is not limited to the liquid crystal apparatus as the electro-optical apparatus and is applicable to an organic electroluminescence (EL) apparatus because a thin-film transistor formed in each pixel region of a device substrate on which an organic EL film is maintained as an electro-optical material, a pixel electrode electrically connected to the thin-film transistor, and a storage capacitor including a lower electrode below a gate insulating layer of the thin-film transistor are formed.

Embodiment of Electronic Apparatus

Figure 18:
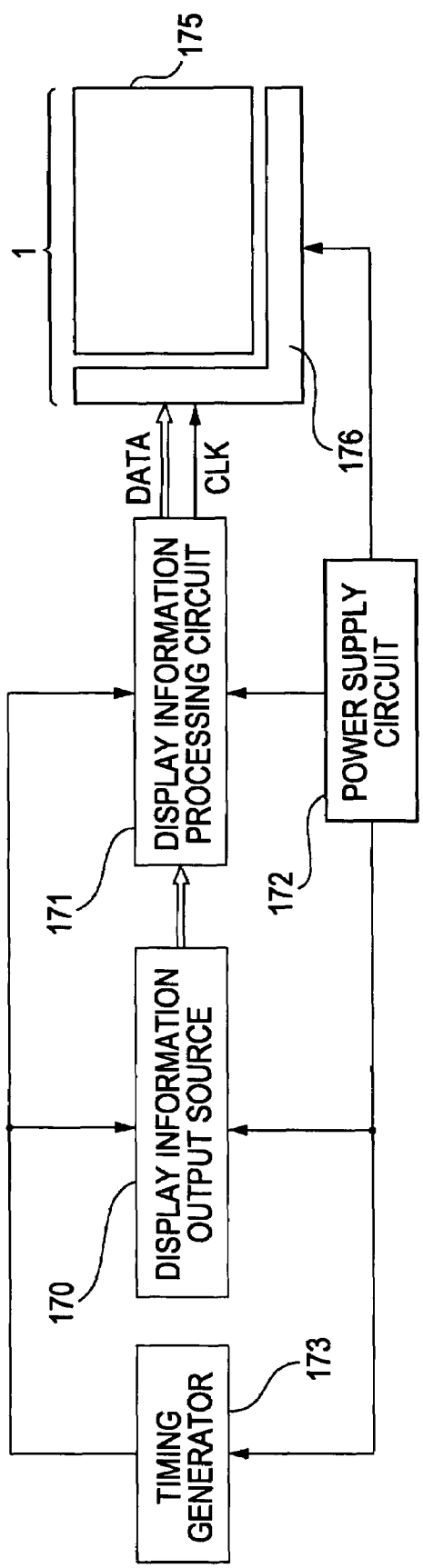
FIG. 18 is a view illustrating a case of using the liquid crystal apparatus according to the invention as a display apparatus in a variety of electronic apparatuses.

FIG. 18 is a view illustrating a case of using the liquid crystal apparatus according to the invention as a display apparatus in a variety of electronic apparatuses. The electronic apparatus described herein is a personal computer or a mobile telephone and includes a display information output source 170, a display information processing circuit 171, a power supply circuit 172, a timing generator 173 and a liquid crystal apparatus 1. The liquid crystal apparatus 1 has a panel 175 and a driving circuit 176 and may be the above-described liquid crystal apparatus 1. The display information output source 170 includes a memory such as a read only memory (ROM) or a random access memory (RAM), a storage unit such as a variety of discs and a tuning circuit for tuning a digital image signal, and supplies display information such as an image signal of a predetermined format to the display information processing circuit 171 on the basis of a variety of clock signals generated by the timing generator 173. The display information processing circuit 171 includes a variety of circuit such as a serial-parallel conversion circuit, an amplification inversion circuit, a rotation circuit, a gamma correction circuit and a clamp circuit, processes the input display information, and supplies the image signal to the driving circuit 176 together with a clock signal CLK. The power supply circuit supplies a predetermined voltage to the elements.

The entire disclosure of Japanese Patent Application No. 2006-142420, filed May 23, 2006 is expressly incorporated by reference.

What is claimed is:

1. A method of manufacturing an electro-optical apparatus including a first thin-film transistor having a first gate electrode, a first gate insulating layer and a first active layer in a pixel region of a device substrate and a second thin-film transistor having a second gate electrode, a second gate insulating layer and a second active layer in a region other than the pixel region of the device substrate, the method comprising:

simultaneously forming the first gate electrode and the second gate electrode;
   forming the first gate insulating layer and the second gate insulating layer;
   forming the first active layer and the second active layer; and
   thinning an insulating film which overlaps the second gate electrode at an upper layer side by etching to reduce the thickness of the second gate insulating layer to be smaller than that of the first gate insulating layer.

2. The method according to claim 1, wherein, in the forming of the gate insulating layer, the insulating film is formed in plural and is thinned while the insulating film is formed in plural, and
   wherein the insulating film formed on the second gate electrode is removed by etching in the thinning of the insulating film.

3. The method according to claim 2, wherein, in the forming of the gate insulating layer, at least a final insulating film is formed at a vacuum atmosphere and the device substrate is continuously maintained in the vacuum atmosphere until the forming of the active layer starts, when the insulating film is formed in plural.

4. The method according to claim 1, wherein, in the forming of the gate electrode, a lower electrode of a storage capacitor is formed in the pixel region, and
   wherein, in the thinning of the insulating film, the insulating film which overlaps the lower electrode at the upper layer side is etched to reduce the thickness of the dielectric layer of the storage capacitor to be smaller than that of the first gate insulating layer.

5. The method according to 1, wherein, in the forming of the gate electrode, a lower conductive layer is formed,
   wherein, in the thinning of the insulating film, the insulting film which overlaps the lower conductive layer at the upper layer side is etched, and
   wherein a contact hole for connecting the lower conductive layer which reaches the lower conductive layer is formed after the active layer is formed.

* * * * *